United States Patent [19]

Buhr et al.

[11] 4,101,323

[45] Jul. 18, 1978

[54] RADIATION-SENSITIVE COPYING COMPOSITION

[75] Inventors: Gerhard Buhr, Königstein; Hans Ruckert; Hans Werner Frass, both of Naurod, all of Fed. Rep. of Germany

[73] Assignee: Hoechst Aktiengesellschaft, Fed. Rep. of Germany

[21] Appl. No.: 669,892

[22] Filed: Mar. 24, 1976

[30] Foreign Application Priority Data

Mar. 27, 1975 [CH] Switzerland ............... 3953/75

[51] Int. Cl.$^2$ ............... G03C 5/00; G03C 1/52; G03C 1/00
[52] U.S. Cl. ............... 96/35; 96/36; 96/36.3; 96/48 R; 96/49; 96/88; 96/90 R; 96/91 R; 96/91 D
[58] Field of Search ............... 96/91 R, 35, 91 D, 36, 96/48, 36.3, 88, 90 R, 49

[56] References Cited

U.S. PATENT DOCUMENTS

| 3,385,700 | 5/1968 | Willems et al. | 96/90 R |
| 3,385,703 | 5/1968 | Poot | 96/88 |
| 3,753,718 | 8/1973 | Lonczak | 96/88 |
| 3,779,778 | 12/1973 | Smith et al. | 96/35.1 |
| 3,810,763 | 5/1974 | Laridon | 96/90 R |

*Primary Examiner*—Mary F. Kelley
*Attorney, Agent, or Firm*—James E. Bryan

[57] ABSTRACT

This invention relates to a radiation-sensitive copying composition comprising a compound (1) which splits-off an acid upon irradiation and a compound (2) having at least one group selected from the group consisting of a carboxylic ortho acid ester group and a carboxylic acid amide acetal group, which composition, upon irradiation, forms an exposure product having a higher solubility in a liquid developer than the non-irradiated composition.

16 Claims, No Drawings

RADIATION-SENSITIVE COPYING COMPOSITION

The present invention relates to a new positive-working, radiation-sensitive copying composition which contains, as the essential components, a compound which splits-off acid upon irradiation, and a compound which comprises at least one C—O—C-bond capable of being split by an acid. The copying composition may be in the form of a copying layer on a support or in the form of a solution. The new positive-working copying composition is distinguished by its high sensitivity to irradiation with light and high-energy radiation, especially electron beams.

Numerous positive-working light-sensitive materials are known. The o-naphthoquinone diazides which are described by Kosar in "Light Sensitive Systems" (Wiley, New York, 1965) on pages 339 to 353 and which are widely used for copying compositions and resist layers, preferably in combination with novolak resins, are the compounds which are most thoroughly investigated and commercially utilized. In recent years, further positive-working systems have been proposed (see "The Journal of Photographic Science", Vol. 18, 1971, page 88, and German Offenlegungsschriften Nos. 2,150,691 and 2,242,106) which are capable of alkaline development to a positive image due to photolytically produced acidic hydrophilic groups. Such positive-working copying materials are characterized in that their light-sensitivity cannot be, or only insignificantly can be, increased by the addition of sensitizers and that it is difficult or even impossible to produce relatively thick positive layers of satisfactory light-sensitivity from these materials because their exposure time is widely determined by the thickness of the layers.

Several attempts have been made to overcome these difficulties. One possibility is to use new chemical systems, such as those suggested in German Offenlegungsschriften Nos. 2,064,380, and 2,338,223, and on page 300 of "Photographic Science and Engineering", 16, 1972. By using higher energy electron beams, positive-working photoresists may be formed by depolymerization. Layers containing polymethyl methacrylate are named as suitable for this purpose (see "Polymer Engineering and Science", 14, 1974, page 516). Layers containing-o-napththoquinone diazides also may be positively imaged by means of electron beams (see German Offenlegungsschrift No. 2,405,831).

As further means to improve the useful light-sensitivity of positive-working copying layers, double layers may be prepared (see German Offenlegungsschrift No. 2,426,159). In this case, the light-sensitive layer acts as a stencil for the second, non-sensitive layer during development. The advantage of an improved light-sensitivity of these layers is accompanied by disadvantages, however, because the contour sharpness of the non-sensitive layer is inferior to and less reliable than that of the copying layer.

Recently, a light-sensitive positive-working mixture of substances has been proposed (U.S. Pat. No. 3,782,939) in which halogen compounds or diazonium salts which are known to be capable of splitting-off acid by a photochemical reaction, are used for the splitting of certain acetals. The splitting products render it possible for the positive-working copying layer to be developed with an alkaline medium. Specifically substituted halogen-methyl-s-triazines are mentioned as particularly useful acid-yielding photoinitiators in German Offenlegungsschrift No. 2,243,621, and the preparation of positive-working transfer layers is mentioned, as a specific application, in U.S. Pat. No. 3,775,113.

The principle described in these publications, i.e. to trigger secondary reactions by photolytically produced acids, has been previously used for the manufacture of positive-working copying layers (see German Offenlegungsschriften Nos. 1,522,495 and 1,572,311), and in particular for negative-working copying layers (e.g. German Offenlegungsschriften Nos. 1,447,913, and 1,522,503 and U.S. Pat. No. 3,708,296). In the meantime, it was found that acetals also may be used in negative-working compositions (German Offenlegungsschrift No. 2,342,068).

Because they require additional processing steps, for example additional heating after exposure, or because their shelf-life is insufficient, the proposed materials still contain certain drawbacks.

It is the object of the present invention to provide a positive-working, radiation-sensitive copying composition which is distinguished from comparable known copying compositions by a higher sensitivity to radiation, especially to light, even in the case of relatively thick layers, and/or by a better shelf-life.

The present invention is based on a radiation-sensitive copying composition containing, as the essential components, a compound (1) which splits-off acid upon irradiation, and a compound (2) which comprises at least one C—O—C-bond capable of being split by an acid.

In the copying composition according to the invention compound (2) capable of being split by an acid is a compound containing at least one ortho-carboxylic acid ester group and/or carboxylic acid amide acetal group.

According to a preferred embodiment of the invention, compound (2) corresponds to the following general formula:

(I)

wherein $R_1$ is H, a substituted or unsubstituted alkyl group, a substituted or unsubstituted phenyl group, or a substituted or unsubstituted cycloalkyl group, $R_2$ is $R_5O$, $R_6(R_7)N$, or

(a) $R_3$ and $R_4$ are the same or different and each represents an alkyl, alkenyl, cycloalkyl, cycloalkenyl, or aryl group which may be substituted, and $R_5$ is a group of the meaning stated above for $R_3$ and $R_4$, or an acyl group, or, when $R_1$ = H and $R_3$ = $R_4$ = phenyl, a methylene amino radical which may be substituted, or (b) any two of the groups $R_3$, $R_4$, and $R_5$ belong to a common ring which may be substituted, $R_6$ is an acyl or sulfonyl radical or a methylene amino group which may be substituted, $R_7$ is an alkyl or phenyl group, and $R_8$ together with the nitrogen atom, forms a possibly substituted, 4 to 13 membered heterocyclic ring which may contain N, O, or S as further hetero atoms and to which 1 or 2 possibly substituted aromatic rings or a cycloaliphatic ring may be fused, and wherein the groups $R_1$, $R_2$, $R_3$, and $R_4$, taken together, contain at least 10 carbon atoms.

According to another preferred embodiment of the invention, the copying composition contains, in addition to the above-mentioned components (1) and (2), at least one binder, more particularly an alkali-soluble binder, preferably a phenol resin.

A good resistivity of the unexposed areas to the developer solutions is normally obtained by carboxylic ortho acid derivatives containing more than 14, preferably more than 18, carbon atoms. This limit is not exact, because the solubility characteristics and hydrophobic properties of the compounds may be varied within wide limits by the introduction of polar substituents, such as carboxylic, ester, carbonamide, cyano, sulfonamido, acyl, ether, or nitro groups. Particularly preferred copying compositions according to the invention are those which contain, as the component (2), a carboxylic ortho acid derivative which contains at least 19 carbon atoms and in which the unit illustrated by Formula I occurs at least once.

The compounds corresponding to Formula I may have monomeric or polymeric characteristics, i.e. one of the groups $R_1$ to $R_4$ may comprise a polymeric, possibly polyfunctional chain which contains units of Formula I as terminal groups or side chains. Further, it is possible for two or more of the groups $R_1$ to $R_4$ to be at least bifunctional and to be attached to at least two o-carboxylic acid derivative units each, thus forming polymer chains containing ortho ester groups or amide acetal groups in the main chain.

More particularly, the above-mentioned groups may have the following meanings:

$R_1$ may be hydrogen, or a straight or branched alkyl group with f1 to 6 carbon atoms which may be substituted, for example by halogen atoms, alkoxy groups, acyl groups, phenyl groups, or groups of the formula $-C(R_2)(OR_3)(OR_4)$ and may contain olefinic double bonds. Preferably, $R_1$ is H, methyl, ethyl, cyclohexyl, phenyl, and expecially H.

$R_2$ may be $R_5O$, $R_6(R_7)N$, or

wherein $R_6$ is an aliphatic, cycloaliphatic, or aromatic acyl group with 2 to 10 carbon atoms, preferably one which is derived from a carboxylic or sulfonic acid and may be substituted, for example by halogen atoms, alkyl groups, alkoxy, nitro, aryl, or acyl groups and groups corresponding to the formula $N(R_7)-C(R_1)(OR_3)(OR_4)$, or $R_6$ is a methylene amino group, preferably a methylene amino group which is substituted at the methylene group by alkyl groups with 1 to 10 carbon atoms, aryl groups with 6 to 10 carbon atoms, or aralkyl groups with 7 to 10 carbon atoms. Preferably, $R_6$ is a benzoyl, a benzene sulfonyl, or a benzalamino group. $R_7$ is an alkyl group with 1 to 6, preferably 1 to 3 carbon atoms, especially methyl, or an aryl group with 6 to 10 carbon atoms, especially phenyl. $R_8$ is a bivalent group which, together with the nitrogen atom, forms a 4 to 13 membered saturated or unsaturated, possibly substituted, carbocyclic or heterocyclic ring in which N, O, or S are present as hetero atoms. The ring may contain carbonyl groups as members of the ring and isolated or conjugated double bonds and may be substituted by halogen atoms, alkyl groups with 1 to 5 carbon atoms, aryl groups with 6 to 10 carbon atoms, acyl groups with 2 to 8 carbon atoms, and alkoxy groups with 1 to 5 carbon atoms and may carry either one or two fused benzene rings which may be substituted by halogen atoms or alkyl groups, or one fused cycloaliphatic, especially 6-membered, ring which also may be substituted. Preferably, $R_2$ is $R_5O$.

If $R_3$ and $R_4$ are isolated groups, they are either straight or branched, saturated or unsaturated alkyl or cycloalkyl groups which may be substituted by ether, ester, acyl, cyano, or possibly substituted carbonamide groups or by halogen atoms, and in which individual members of a chain or ring may be replaced by oxygen, or $R_3$ and $R_4$ are mono- to tri-nuclear aromatic groups which may be substituted, for example by halogen, nitro, alkyl, cycloalkyl, aryl, aralkyl, alkoxy, aryloxy, cyano, sulfonyl, acyl, or carboalkoxy groups. $R_5$ is either a group of the same meaning as $R_3$ and $R_4$, or an aliphatic or aromatic acyl group, or when $R_1$ stands for H and $R_3$ and $R_4$ are phenyl groups, $R_5$ is a methylene amino radical, which means that $R_5O$ is the radical of an oxime. Preferably, the methylene group is substituted; alternatively, it may form part of a cycloaliphatic ring. Suitable substituents are alkyl groups with 1 to 10 carbon atoms and especially aryl groups with 6 to 10 carbon atoms.

If $R_3$, $R_4$, and $R_5$ are aliphatic groups, each of them preferably has 1 to 18 carbon atoms; they are preferably alkyl groups. The term "alkyl" also encompasses those aliphatic groups in which individual members of a chain are replaced by oxygen and/or which contain unsaturated groups.

Suitable groups are in particular polyethylene glycol monoalkyl ether groups of the general formula $-(CH_2CH_2O)_n$-alkyl, wherein n is an integer from 1 to 8.

If $R_3$, $R_4$, and $R_5$ are aromatic groups, they normally have between 6 and 20 carbon atoms. Mononuclear and binuclear groups are preferred, especially compounds in which two of these groups are mononuclear. The number of carbon atoms mentioned refers only to those groups which are attached to one ortho ester or amide acetal group only. In compounds containing two or more of such groups — which are used with particular advantage — the number of carbon atoms may, of course, be much higher, when seen from a group corresponding to Formula I.

Suitable examples are: ortho formic acid ester, ortho acetic acid ester, ortho propionic acid ester, ortho benzoic acid ester, ortho cyclohexane carboxylic acid ester, preferably ortho formic acid trinonyl ester, -tridecylester, -triundecyl ester, -tridodecyl ester, -tritetradecyl ester, -trihexadecyl ester, -tristearyl ester, -trioleanyl ester, ortho formic acid-tris-3-oxa-decyl ester, -tris-3,6-dioxadodecyl ester, -tris,3,6,9-trioxa-tridecyl ester, -tris-3,6,9,12-tetraoxa-hexadecyl ester, -tris-3,6,9,12,15-pentaoxa-heptadecyl ester, -tris-3,6,9,12,15,18,21,24-octaoxa-pentacosyl ester, ortho acetic acid tris-3,6,9-trioxa-tridecyl ester, and, for example, ortho formic acid-tris-3,5,5-trimethyl hexyl ester or -tris-4,9,12-trimethylpentadecyl ester, and the ortho formic acid ester of tripropylene glycol monomethyl ether.

Examples of suitable mixed aliphatic-aromatic ortho esters are the ortho carboxylic acid aryl dialkyl esters, for example the diethoxy and dipropoxy methyl ethers of p-cumylphenol, the bis-dimethoxy-,bis-diethoxy-, and bis-dipropoxy-methyl ethers of bis-phenol A, and the mono- or polyvalent aromatic hydroxy compounds listed below.

If two of the groups $R_3$ to $R_5$ are closed to form a ring, this ring may have 5, 6, or 7, preferably 5 or 6 members, the oxygen atoms being included, and may be substituted by halogen, preferably chlorine, by alkoxy with 1 to 6 carbon atoms, by benzyloxy, aryloxy, preferably phenoxy, or by alkoxy carbonyl with 1 to 5 carbon atoms, preferably methoxy carbonyl or ethoxy carbony. Exemplary of such a ring is a, possibly substituted, 1,3-dioxolane-4-on-2-yl radical. Methods for the preparation of such compounds are described in "Chem. Ber.," 108, 3224, 1975. The third group may be formed by an alcohol group, preferably the radical of an aliphatic alcohol, or a phenol or naphthol which may be substituted.

Examples of this group of compounds are: 1,3-dioxolan-2-yl- and -2-alkyl-, preferably 2-methyl-1,3-dioxolan-2-yl- and 2-phenyl-1,3-dioxolan-2-yl-ethers of long-chain aliphtic alcohols, diols and polyglycols, for example the 1,3-dioxolan-2-yl-ether of pentaethylene glycolmonhexyl ether, the bis-1,3-dioxolan-2-yl-ether of octadecane-1,12-diol, the bis-1,3-dioxolan-2-yl-ethers of pentaethylene glycol, of hexaethylene glycol, and of polyethylene glycol mixtures, such as polyglycols 200, 300, 500, and 1,000, and the 2-methyl- or phenyl-1,3-dioxolan-2-yl-ethers corresponding to the compounds listed above, further ethers formed by 1,3-dioxolan-2-yl groups further substituted in the 4- or in the 4- and 5-positions, for example 4-chloromethyl-4-phenoxy methyl-, 4-tolyloxy methyl-, 4,5-dimethyl-, 4,5-diphenyl-, 4,5-di-methoxy-carbonyl- and 4,5-diethoxy-carbonyl-1, 3-dioxolan-2-yl-bis ethers of 1,12-dodecane-diol or tri, tetra-, or hexaethylene glycol, and the above-mentioned polyglycols. Instead of the 1,3-dioxolan-2-yl-groups unsubstituted in the 2-position, those containing 2-methyl-, 2-chloromethyl-, 2-cyclohexyl- or 2-phenyl substituents also may be used. Further examples are the 1,3-dioxan-2-yl-ethers of the above-mentioned group of alcohols, for example hexaethylene glycol-bis-1,3-dioxan-2yl ethers, 1,12-dodecanediol-bis-5,5-dimethyl-1,3-dioxan-2-yl-ethers, the triethylene-glycol-butyl-(2,5-diethyl-5-butyl-1,3-dioxan-2-yl)- and -(5-ethyl-5-butyl-2-phenyl-1,3-dioxan-2-yl))-ethers, the bis-ethers of tri-, tetra-, and penta-ethylene glycols corresponding to the two last-mentioned compounds, and, for example, 5-alkoxy- or 5-phenoxy-1,3-dioxan-2-yl-ether. Further, those bis-1,3-dioxolan-2-yl ethers may be used in which the diol forming the basis of the 1,3-dioxolanyl group is also present as the connecting diol component, for example 1-phenoxy-2,3-bis-(4-phenoxymethyl-1,3-dioxacyclopent-2-yl-oxy)-propane, which are produced by co-trimerizing substituted or unsubstituted 1,2-diols with 2 equivalents of an orth carboxylic acid ester, or are formed when reacting 2-alkoxy-1,3-dioxolanes with the appropriate 1,2-diols.

Further compounds which may be mentioned are the 1,3-dioxolan-2-yl-ethers or 1,3-dioxan-2yl-ethers or naphthols or of bisphenol-A, and the 4,7-dihydro-1,3-dioxepin-2-yl-ethrs or long-chain alcohols and polyglycols. 2-Alkoxy-4,7-dihydro-1,3-dioxepins are described, for example, in U.S. Pat. No. 3,652,594.

A particularly advantageous sub-class of the above-described compounds are compounds corresponding to the following Formula II:

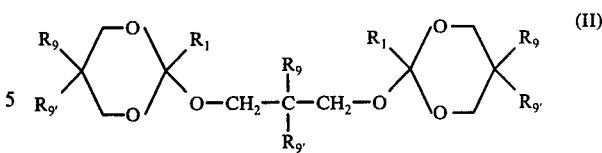

in which $R_1$ has the meaning given above, $R_9$ is hydrogen, alkyl, or alkenyl with 1 to 10 carbon atoms, or aryl, in particular phenyl, preferably, however, hydrogen, methyl or ethyl, and $R_9$ is alkyl with 1 to 10 carbon atoms, preferably with 1 to 6 carbon atoms, which may be substituted by halogen, preferably chlorine, or by cyano, or alkoxy with 1 to 5 carbon atoms, or phenoxy, alkenyl with 1 to 10 carbon atoms, preferably 1 to 6 carbon atoms, aryl, preferably phenyl, alkoxy with 1 to 10 carbon atoms, or aryloxy, preferably phenoxy which may be substituted, the sum of the carbon atoms of all of the residues $R_1$, $R_9$ and $R_9$, being at least 3, more advantageously at least 5, and $R_9$ and $R_9$, being connected with each other to form a ring system, if desired.

The compounds corresponding to Formula II are prepared most advantageously by co-trimerization of substituted 1,3-diols with 2 equivalents of an ortho formic acid trialkyl ester in the presence of acid catalysts, such as p-toluene sulfonic acid or sulfuric acid, or of an acid ion exchanger. Alternatively, they may be obtained by a reaction of the diol with the appropriate 2-alkoxy-1,3-dioxanes, which in turn, are obtained from the diols by reaction with an excess of ortho carboxylic acid ester.

The following compounds are mentioned as examples: compounds corresponding to Formula II in which:

$R_1$ and $R_9$ are hydrogen and $R_9$, is hexyl, isoamyloxy, phenoxy, 4-tolyloxy, 2-butoxyethyl, or 2-phenoxy ethyl;

$R_1$ is hydrogen, and $R_9$ and $R_9$, are methyl, ethyl, propyl, butyl, phenyl, or $R_9$ and $R_9$, taken together, are pentamethylene;

$R_1$ is hydrogen, $R_9$ is ethyl, and $R_9$, is methyl, allyloxymethyl, or butyl;

$R_1$ is methyl, ethyl, cyclohexyl, or phenyl, $R_9$ is ethyl, and $R_9$, is butyl, or $R_1$ is methyl, ethyl, cyclohexyl, or phenyl, $R_9$ is hydrogen, and $R_9$, is phenoxy.

Ortho-carboxylic acid derivatives, especially ortho carboxylic acid esters, in which at least one of the radicals $R_3$, $R_4$, and $R_5$, preferably two of them, are aromatic groups, have proved to be particularly advantageous.

Preferred representatives of such ortho-carboxylic acid derivatives contain at least one, preferably 1 to 3, and most advantageously 2 diaryl-oxy-methoxy groups corresponding to the following formula III:

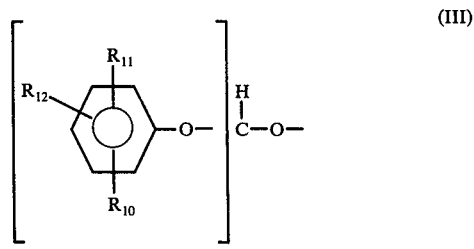

in which $R_{10}$, $R_{11}$, and $R_{12}$ are hydrogen, lower alkyl groups with 1 to 6 carbon atoms, which may be substituted by alkoxy, alkoxy carbonyl, and acyl groups with 1 to 3 carbon atoms, or by halogen, preferably chlorine, or cyano, alkoxy radicals with 1 to 6 carbon atoms, acyl radicals with 1 to 7 carbon atoms, alkoxy carbonyl groups with 1 to 5 carbon atoms, fluorine, chlorine, bromine, cyano, and nitro groups, or phenoxy, thiophenyl, aryl-sulfonyl or aralkyl groups, which may be substituted, in particular 2-phenyl-2-propyl groups, or in which $R_{10}$ is hydrogen and $R_{11}$ and $R_{12}$ are the methine groups necessary for the formation of a naphthalene ring, the combination that $R_{10}$, $R_{11}$, and $R_{12}$ are hydrogen and the combination that $R_{10}$ and $R_{11}$ are hydrogen and $R_{12}$ is methyl, methoxy, chlorine, or 2-phenyl-2-propyl, and the combination that $R_{10}$ is hydrogen and $R_{11}$ and $R_{12}$ are the methine groups necessary for the formation of a naphthalene ring, being particularly preferred.

In addition to the compounds described in detail below, the following compounds are suitable: di(p-tolyloxy)-methyl-ether, di(2,6-dimethyl-phenoxy)-methyl-ether, di-(p-chlorophenoxy)-methyl-ether, or di(p-methoxyphenoxy)-methyl-ether of long-chain aliphatic alcohols, polyglycols, phenols, dihydroxy benzenes, naphthols, and dihydroxy naphthols, for example 1-di-p-tolyloxy-methoxy-dodecane, 1,15-bis [di-(2,6-dimethyl-phenoxy)methoxy]-3,6,9,12-tetraoxa-tetradecane, 1-di-(p-chlorophenoxy)methoxy-4-(2-phenyl-prop-2-yl)-benzene, bis-2,4-[di-(p-chlorophenoxy)-methoxy[-acetophenone, 2-di-p-tolyloxy-methoxy-naphthalene, or 2,7-bis-(di-p-tolyloxy-methoxy)-naphthalene, further the diphenoxy methoxy derivatives of substituted or unsubstituted benzenes, e.g. diphenoxy-methoxy-2,6-dimethyl-benzene, 4-tert.-butyl-diphenoxy-methoxy-benzene, and diphenoxy-methoxy-benzoic acid esters, such as 2-diphenoxy-methoxy-benzoic acid butyl ester or 4-diphenoxy-methoxy-benzoic acid-3,6,9-trioxatridecylester; or the diphenoxy-methoxy derivatives of substituted or unsubstituted naphthalenes, such as 1- or 2-diphenoxy-methoxy or 1-methyl-2-diphenoxy-methoxy-naphthalene, or of quinolines, e.g. 8-diphenoxy-methoxy-quinoline; or of substituted or unsubstituted anthracenes or phenanthrenes, e.g. 1- or 9-diphenoxy-methoxy-anthracene.

These compounds may be prepared by reaction, in the presence of acid-binding substances, of the appropriate hydroxy compounds with the corresponding diaryl oxy-chloromethanes described in "Rec. Trav. Chim.", 92, 11, 1973.

Further compounds which are mentioned as examples are the triaryl oxymethanes, as the simplest compound triphenoxy methane, but also tricresyl-oxymethane, tri-p-chlorophenoxy-methane, tri-p-nitrophenoxy-methane, tri-(2,6-dimethyl-phenoxy)-methane, tri-(2,4,6-trimethyl-phenoxy)-methane, tri-α-naphthoxy-methane, di(p-chlorophenoxy)-phenoxy-methane, and di-(p-nitrophenoxy)-phenoxy-methane, the preparation of which is described in "Rec. Trav. Chim.", 90, 745, 1972, furter di-(β-naphthoxy)-phenoxy-methane, di(p-cumylphenoxy)-phenoxy-methane, and tri-p-cumylphenoxy-methane. These compounds are prepared by replacing the halogen atoms in aryl-dichloro-methyl ethers by aryloxy radicals.

Further compounds which may be mentioned as examples are the diphenoxy methyl ethers of long-chain aliphatic alcohols, e.g. 1-(diphenoxy-methoxy)-dodecane, or of diols, e.g. 1,12-bis-(diphenoxy-methoxy)-dodecane, or of polyglycol ethers, e.g. 1-diphenoxy-methoxy-3,6,9-trioxa-tridecane, or of aliphatic alcohols in almost any desired variation, including the enols of the following formulae, for example:

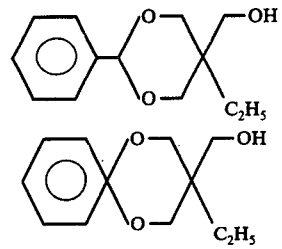

or of di-(p-methoxy-phenyl)-carbinol or 2-methyl-3-hydroxy-cyclohex-2-en-1-one.

Diphenoxy methyl esters, e.g. benzoic acid-diphenoxy-methyl ester or terephthalic acid-bis-diphenoxy-methyl ester, also may be used. These structurally very different compounds, which are described in detail in the examples, are mentioned here only as representatives of the vast number of diphenoxy methoxy derivatives which may be used within the scope of the present invention. They are synthesized without difficulty from the hydroxy compounds, by reaction with diphenoxy chloro methane (see "J. Prakt. Chem." (4), 7, 60, 1958) in the presence of acid-binding agents, e.g. pyridine or triethyl amine.

Particularly advantageous are also diphenoxy methyl esters of dihydroxy benzenes which may have two substituents in the central benzene nucleus, the first of these substituents being hydrogen, alkyl with 1 to 3 carbon atoms, chlorine, bromine, cyano, acyl with 1 to 3 carbon atoms, alkoxy with 1 to 3 carbon atoms, or nitro, preferably, however, hydrogen, and the second being hydrogen, alkyl with 1 to 8 carbon atoms, cycloalkyl, preferably alkyl with 1 to 6 carbon atoms and cyclohexyl, alkoxy with 1 to 6 carbon atoms, phenyl, phenoxy, benzyl, $R_{13}CO$, wherein $R_{13}$ is alkyl with 1 to 8 carbon atoms, preferably alkyl with 1 to 5 carbon atoms, cycloalkyl, preferably cyclohexyl, aryl, preferably phenyl, alkoxy with 1 to 9 carbon atoms, preferably alkoxy with 1 to 6 carbon atoms, cyclohexoxy, phenoxy, or dialkylamino, halogen, preferably chlorine or bromine, cyano, nitro, or diphenoxy-methoxy.

Examples of such compounds are: the bis-diphenoxy-methyl ethers of resorcinol, hydroquinone, 4-methyl-pyrocatechol, 4-tert.-butyl-resorcinol, 2-cyclohexyl-hydroquinone, 3,4-dihydroxy-biphenyl, 5-phenoxy-resorcinol, 4-cyano-resorcinol, 4,5-dimethyl-pyrocatechol, 4-n-hexyl-resorcinol, 2,4-dihydroxy-benzoic acid methylester, -ethyl ester, -isopropyl ester, -butyl ester, and -isoamyl ester, of 3,5-dihydroxy-benzoic acid methyl ester, -ethyl ester, -propyl ester, -butyl ester, and -isoamyl ester, of 4-acetyl-resorcinol, 4-propionyl-resorcinol, 4-valeryl-resorcinol, 4-isononanoyl-resorcinol, 4-benzoyl-resorcinol, 4-benzyl-resorcinol, 4-cyano-resorcinol, 4-chloro-resorcinol, or 4-nitro-resorcinol, of 4-benzyl-pyrocatechol, or 2-methoxy- or 2-butoxy-hydroquinone, or of 2,4-dihydroxy-benzoic acid dimethyl amide, as well as the tris-diphenoxy methyl ethers of phloroglucinol and 1,2,4-trihydroxybenzene.

Further preferred compounds are the bis-diphenoxy-methoxy naphthalenes, e.g. 1,2-, 1,3-, 1,4-, 1,6-, 1,7-, 1,8-, 2,3-, 2,5-, or 2,7-bis-diphenoxy methoxy naphthalenes. The naphthalene ring may carry further substituents, such as 1-chloro- or 1-methyl-substituents. The 1,5- and 2,6-bi-diphenoxy methoxy naphthalenes are somewhat less advantageous because of their low solubility.

Further ortho carboxylic acid derivatives which are of particular interest are the compounds according to Formula IV:

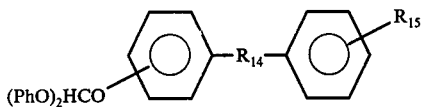

Ph = phenyl in which the diphenoxy methoxy group and the group $R_{15}$ are preferably in the 4,4'-positions and $R_{14}$ is one of the groups —O—, —S—, —SO$_2$—, —CO—, —COO—, CH$_2$CO—, —COCH$_2$—, —CH$_2$O—, —OCH$_2$—, CH$_2$—COO—, —COOCH$_2$—,

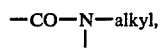

or alkylene, preferably dimethyl methylene and phenyl methylene, or CH$_3$—C—(CH$_2$)$_2$COOR$_{16}$, wherein R$_{16}$ is hydrogen, or alkyl with 1 to 3 carbon atoms, or diphenoxy methyl, and is in particular —O—(CH$_2$CH$_2$)$_{2-4}$—O when the 3,3'-positions are occupied, and wherein R$_{15}$ is hydrogen, alkyl with 1 to 3 carbon atoms, halogen, preferably chlorine or bromine, acyl with 1 to 3 carbon atoms, alkoxy with 1 to 3 carbon atoms, carboalkoxy with 1 to 4 carbon atoms, cyano, nitro, or diphenoxy methoxy, preferably diphenoxy methoxy or hydrogen.

Exemplary of this group of compounds are: the diphenoxy-methyl ethers of 3-phenoxy-phenol, 4-phenoxy-phenol, 4-hydroxy-di-phenyl-sulfide, 2-, 3-, or 4-hydroxy-benzophenone, 4-hydroxy-benzoic acid phenyl ester, benzoic acid-4-hydroxy-phenyl ester, 4-hydroxy-benzoic acid-(methyl-phenyl)-amide, hydroquinone-monobenzyl ether, 4-phenoxy-methyl-phenol, 4-hydroxy-phenyl-acetic acid phenyl ester, 3- or 4-hydroxy-diphenyl methane, 4-hydroxy-triphenyl methane, cumyl phenol, the bis-diphenoxy-methyl ethers of 4,4'-dihydroxy-diphenyl ether, 4,4'-dihydroxy-diphenyl-sulfone, 4,4'-dihydroxy-diphenyl-sulfide, 4-4'-dihydroxy-benzophenone, 3,4'-dihydroxy-benzophenone, 4-hydroxy-phenyl acetic acid-4-hydroxy-phenyl-ester, hydroquinone-4-hydroxy-benzyl ether, 4-hydroxy-benzoic acid-(ethyl-4-hydroxy-phenyl)-amide, 3,3'-dihydroxy-diphenyl-methane, bis-phenol-A, 4,4'-dihydroxy-triphenyl-methane, 4,4-di-(4-hydroxy-phenyl)-valeric acid, -valeric acid methyl ester, -ethyl ester, -propyl ester, and -diphenoxy-methyl ester, 1,2- bis-(3-hydroxy-phenoxy)-ethane, 1,4-bis-(3-hydroxy-phenoxy)-butane, and also the diphenoxy-methyl ethers of 4-ethyl-4'-hydroxy-diphenyl ether, 3-bromo-4'-hydroxy-benzophenone, 4-hydroxy-4'-methoxy-diphenyl-sulfone, 4-acetyl-4'-hydroxy-diphenyl-methane, and the above-mentioned valeric acid derivatives in which the 4-hydroxy-phenyl groups are replaced by 4-hydroxy-3-methyl-phenyl groups.

Further compounds which are particularly advantageous are the bis-diphenoxy-methyl ethers of polyethylene glycols with 1 to about 23, preferably from 2 to 11, oxyethylene units. The higher value stands for the average value calculated from the hydroxyl number of commercial polyglycols, on the assumption that the compound is uniform.

Examples of suitable compounds are the bis-diphenoxymethyl ethers of ethylene glycol, diethylene glycol, triethylene glycol, tetraethylene glycol, pentaethylene glycol, and hexaethylene glycol, and for polyglycols 200, 300, 400, 500, 600, and 1000.

Further it is possible for polypropylene glycols to be converted into the bis-diphenoxy methyl ethers.

Finally, amide acetals in which R$_2$ is R$_6$N(R$_7$) are suitable ortho carboxylic acid derivatives.

The N-methyl- and N-ethyl-N-diphenoxy-methyl-amides of benzoic acid and of benzene sulfonic acid are exemplary.

If R$_2$ is the group

the N-diphenoxy-methyl derivatives of lactams are preferred representatives, e.g. derivatives of 4-methyl-azetidin-2-one, 4,4-dimethyl-azetidin-2-one, 3,4,4-trimethyl-azetidin-2-one, 3,4-dimethyl-azetidin-2-one, 4-phenyl-azetidin-2-one, 4-vinyl-azetidin-2-one, pyrrolidin-2-one, 3,3-dimethyl-pyrrolidin-2-one, 4-phenyl-pyrrolidin-2-one, 5-methyl-pyrrolidin-2-one, 5,5-dimethyl-pyrrolidin-2-one, and of substituted or unsubstituted lactams with relatively high numbers of members, such as valero lactam, caprolactam, and laurin-lactam, lactams with fused rings, such as cis-3,4-trimethylene-azetidin-2-one, isatin, phthalimidine, and 3,4-dihydro-carbostyryl.

Further compounds which are suitable are the N-diphenoxy methyl derivatives of cyclic imides, such as maleic imide, succinic imide, glutaric imide, hexahydro-phthalic imide, phthalic imide, and substituted phthalic imides, such as tetrachloro-phthalic imide, but also of other 5- or 6-membered - preferably 5-membered - heterocyclic compounds which may be fused to one or two carbocyclic rings, e.g. 2-acetyl-pyrrol, 2-ethoxy-carbonyl-pyrrol, benzimidazole, 1-phenyl-3-methyl-pyrazol-5-one, carbazole, phenothiazine, and 1,4-dihydrocolli-din-3,5-dicarboxylic acid diethyl ester.

Further suitable compounds are ortho carboxylic acid derivatives in which R$_2$ is R$_6$(R$_7$)N and R$_6$ is a methylene amino radical, so that R$_2$ forms the residue of an N-alkyl-hydrazone or N-aryl hydrazone connected by an N atom. Preferably, R$_2$ is the radical of the N-phenyl-hydrazone or an aliphatic or aromatic aldehyde or ketone, preferably one with 2 to 8 carbon atoms. In this case, the radical —CR$_2$(OR$_3$)(OR$_4$) preferably is the diphenoxy methyl radical. Examples of such compounds are: N-diphenoxy-methyl-acetaldehyde-N-phenyl-hydrazone, N-diphenoxy-methyl-benzaldehyde-N-phenyl-hydroazone, and N-diphenoxy-methyl-acetophenone-N-phenyl-hyrazone.

Finally, the ortho carboxylic acid derivatives are to be mentioned in which R$_5$ is a methylene imino radical, i.e. the residue of the oxime of an aliphatic or aromatic aldehyde or ketone, having preferably from 2 to 13 carbon atoms attached to the oxygen atom, or for —CR$_1$(OR$_3$)(OR$_4$), preferably the diphenoxy methyl radical. O-diphenoxy-methyl-acetald-oxime, -cyclohexanone-oxime, -benzald-oxime, and -benzophenone-oxime are suitable compounds.

The above-mentioned ortho carboxylic acid derivatives are likewise prepared by reacting the free hydroxyl compounds or the N-mono-substituted amides, the lactams, imides, the NH groups in heterocyclic compounds and in N-mono-substituted hydrazones, or the hydroxy groups of oximes, with diphenoxy-chloromethane.

On pages 1 to 133 of his book "Carbocyclic Ortho Acid Derivatives" (published in a series of monographs entitled "Organic Chemistry" by Academic Press, New York and London, 1970), and in the periodical "Synthesis" 1974, page 153, R. H. DeWolfe informs generally about the variety of manufacturing methods of ortho esters.

For the preparation of the positive-working copying compositions according to the invention, the ortho carboxylic acid derivatives described above are mixed with substances which produce acids under photochemical action and/or by the action of high-energy radiation, especially electron beams.

Novolak condensation resins which have proved suitable for many positive-working copying compositions are particularly suitable and advantageous for use in the copying compositions according to the present invention. They contribute to a pronounced differentiation between the exposed and the unexposed areas of the layer during development, especially the more condensed resins containing substituted phenols as the formaldehyde condensation partner. The type and quantity of the novolak resin used may vary according to the intended purpose; a novolak content ranging from 30 to 90 percent by weight, preferably from 55 to 85 percent by weight of the solids, is preferred. The novolaks may be modified by a reaction of part of their hydroxy groups, e.g. with chloroacetic acid, isocyanates, epoxides, or carboxylic acid anhydrides. In addition to the novolaks, numerous other resins may be incorporated, vinyl polymerizates such as polyvinyl acetates, polyacrylates, polyvinyl ethers, and polyvinyl pyrrolidones which, in turn, may be modified by co-monomers, being preferred. The most favorable proportion of such resins depends upon practical requirements and upon the influence of the conditions of development; normally, it does not exceed 20 percent by weight of the novolak component. For special requirements, as regards flexibility, adhesion, gloss etc., other substances, such as polyglycols, cellulose derivatives, such as ethyl cellulose, wetting agents, dyestuffs, and finely divided pigments may be added to the light-sensitive composition in small quantities.

As the radiation-sensitive component, which splits-off acid upon irradiation with light or with electrons of adequate energy, any of a vast number of known diazonium salts, halogen compounds, and quinone diazide sulfochlorides may be used.

Suitable diazonium salts are the compounds with a useful absorption range between 300 and 600 nm which are used in the diazotype field. A number of suitable diazonium compounds which are known to possess a satisfactory shelf life are mentioned in the examples, compounds having no basic substituents being preferred.

As a rule, the diazonium compounds are used in the form of their organic solvent-soluble salts, normally as the separation products with complex acids, such as hydrofluoboric or hexafluophosphoric acid.

Alternatively, derivatives of positive-working o-quinone diazides may be used. In most cases, the indene carboxylic acid formed by exposure of o-naphthoquinone diazides barely suffices for a satisfactory image-wise differentiation. Among this group, the naphthoquinone-1,2-diazide-4-sulfochloride is preferred because during exposure thereof three acid functions are formed which give rise to a relatively high degree of intensification during the splitting of the ortho esters.

Principally, all organic halogen compounds known as free radical-forming photoinitiators may be used has halogen-containing radiation-sensitive compounds capable of forming a hydrohalic acid, for example, those containing more than one halogen atom attached to a carbon atom or an aromatic ring. Examples of such compounds are described in U.S. Pat. Nos. 3,515,552, and 3,536,489, and in German Offenlegungsschriften Nos. 2,306,248, and 2,243,621. The effect of these halogen-containing compounds in the positive-working copying layers according to the invention may be spectrally influenced and increased by known sensitizers.

Further, certain substituted trichloro-methyl-pyrones may be used.

Examples of suitable initiators are:
4-di-n-propyl-amino-benzene-diazonium-tetrafluoborate,
4-p-toylymercapto-2,5-diethoxy-benzene-diazonium-hexafluo-phosphate,
4-p-tolylmercapto-2,5-diethoxy-benzene-diazoniumtetrafluoborate, diphenyl-4-diazonium sulfate,
4-methyl-6-trichloromethyl-2-pyrone,
4-(3,4,5-trimethoxy-styryl)-6-trichloromethyl-2-pyrone,
4-(4-methoxy-styryl)-6-(3,3,3-trichloro-propenyl)-2-pyrone,
2-trichloromethyl-benzimidazole,
2-tribromomethyl-quinoline,
2,4-dimethyl-tribomoacetyl-benzene,
3-nitro-1-tribromo-acetyl-benzene,
4-dibromoacetyl-benzoic acid,
1,4-bis-dibromomethyl-benzene,
tris-dibromomethyl-s-triazine, and
the compounds mentioned in the examples.

The quantity of initiator may widely vary depending upon the substance used and the composition of the layer. Favorable results are obtained with quantities ranging from about 0.1 to about 10 percent by weight, based on the total weight of the solids, quantities in the range from 0.5 to 5 percent by weight being preferred. Especially in the case of layers of more than $10\mu$ thickness. It is recommended to add only a relatively small quantity of the acid-donor to the layer.

Finally, soluble or finely distributed, dispersible dyestuffs may be added to the light-sensitive composition, and also UV absorbing agents if required for the intended use of the material. The most favorable proportions of the various components contained in the layer may be determined by zeroing in on optimum conditions within these limits.

Suitable solvents for the compositions according to the invention are ketones, such as methyl ethyl ketone, chlorinated hydrocarbons, such as trichloro-ethylene and 1,1,1-trichloroethane, alcohols such as n-propanol, ethers such as tetrahydrofuran, alcohol ethers such as ethylene glycol monoethyl ether, and esters such as butyl acetate. Mixtures of these solvents also may be used, and other solvents, such as acetonitrile, dioxane, or dimethyl formamide may be added for special purposes. Principally, all solvents are suitable which do not undergo an irreversible reaction with the components of the layer.

When selecting the solvent, however, the intended coating method, the thickness of the layer, and the drying apparatus to be used should be considered. Thin layers of up to about $5\mu m$ prepared in small quantities for testing purposes, are preferably applied by whirler-coating. In this manner, layers of a thickness of up to about 60μm may be produced by a single application or by means of a doctor knife from solutions havng a solids content of up to 40 percent. If both surfaces are to be coated, a dip coating process is preferred, advantageously using a solvent of low boiling point so that the coating dries quickly. Webs are coated by roller application, nip coating, or by spraying; sheet materials, such as zinc or multimetal plates, may be coated with the aid of a curtain coater.

As compared with other known positive-working layers, especially those containing naphthoquinone diazides, greater advantages are achieved with the production of relatively thick layers, because the light-sensitivity of the light-sensitive compositions according to the invention is less dependent on the thickness of the layers. Exposure and processing of layers having a thickness of up to 100μm and more is possible.

In the case of relatively thick layers of more than 10μm thickness, the preferred supporting materials are plastic films, which serve as temporary supports for transfer layers. For this purpose, and for color proofing films, polyester films, e.g. polyethylene terephthalate films, are preferred. Polyolefin films, e.g. polypropylene films, also may be used, however. In the case of layers below a thickness of about 10μm, metals are normally used as supports. For the preparation of offset printing plates, mechanically or electrochemically roughened aluminum plates may be used, which additionally may be pretreated by a chemical process, for example with polyvinyl phosphonic acid, silicates, or phosphates. Multi-metal plates containing layers of copper and chromium or layers of brass and chromium are also suitable. For use as relief printing plates, the layers according to the present invention may be applied to zinc or magnesium plates, to commercially available microcrystalline alloys thereof suitable for powderless etching, or to etchable plastic materials, such as "Hostaform". Due to their good adhesion to and etching resistance on copper or nickel surfaces, the ortho carboxylic acid derivative layers according to the invention are suitable for use as intaglio and screen printing plates.

Finally, the coating may be applied either directly, or by lamination of temporary supports to circuit boards composed of insulating plates with a copper layer on one or both surfaces thereof, or to glass or ceramic materials which may be pretreated with an adhesion promoter, or to slices of silicon which, in micro-electronics, are suitable for imaging by electron beams. Moreover, it is possible to coat wood, textiles, and the surfaces of many materials, the coated surfaces being advantageously imaged by projection and provided that the materials are resistant to the attack of alkaline developers.

Conventional apparatuses and conditions may be used for drying the coated layers, temperatures around 100° and even brief heating to 120° C being withstood by the layers without impairment of their light-sensitivity.

The light sources normally used for copying, viz, tubular lamps, pulsed xenon sources, metal halide-doped high pressure mercury vapor lamps, and carbon arc lamps, also may be used for exposure of the material according to the present invention. In addition thereto, the light-sensitive carboxylic ortho acid derivative layers may be exposed in conventional projection and enlargement apparatuses to the light of metallic-filament lamps or by contact exposure under normal incandescent bulbs. Further, coherent laser beams may be used for exposure. For the purposes of the present invention, short-wave lasers of adequate energy, for example argon lasers, krypton-ion lasers, dyestuff lasers, and helium-cadmium lasers emitting between 300 and 600 nm were found to be suitable. The laser beam is directed by a given, programmed line and/or screen movement.

As a further possiblity, the material according to the invention may be imaged with electron beams. The copying compositions according to the invention, the same as numerous other organic materials, may be thoroughly decomposed and cross-linked by electron beams, so that a negative image is formed after the unexposed areas have been removed by a solvent or by exposure without an original and development. In the case of an electron beam of lower intensity and/or higher operating speed, however, the electron beam causes a differentiation toward a higher solubility, i.e. the irradiated areas of the layer may be removed by a developer. It was found that the layers containing the carboxylic ortho acid derivatives according to the invention are considerably more sensitive to electron beams than are normal naphthaquinone diazide layers, and that a wide range of electron beams of relatively low energy efficiency may be used, as illustrated by the examples. The most favorable conditions may be easily ascertained by preliminary tests.

After image-wise exposure or irradiation with electron beams, the carboxylic orth acid derivative layer according to the invention may be removed by means of the same developers as are used for commercial naphthoquinone diazide layers and resist layers, or the copying conditions of the new layers may be advantageously adapted to known auxiliaries, such as developer solutions and programmed spray developing devices. The aqueous developer solutions used may contain alkali phosphates, alkali silicates, or alkali hydroxides, and also wetting agents and organic solvents. In certain cases, mixtures of solvents and water may be used for development. The most suitable developer may be determined by running tests with the layer in question. If necessary, the developing process may be assisted by mechanical means.

In order to increase their mechanical strength during the printing process and their resistance to wash-out solutions, correcting agents and UV-hardenable printing inks, the developed plates may be briefly heated to relatively high temperatures, as is known for diazo layers and described, for example, in British Pat. No. 1,154,749.

Further, it was found according to the present invention that not only the copying compositions containing the carboxylic ortho acid derivatives of the invention, but also certain known copying compositions may be used with special advantage for recording electron beams and other high-energy radiation.

Thus, the present invention further provides a process for recording high-energy radiation, especially electron beams, according to which process a radiation-sensitive recording material composed of a support and a radiation-sensitive layer comprising, as the essential components, a compound (1) which splits-off acid during irradiation, and a compound (2) whose solubility is increased by the action of an acid, is image-wise irradiated with high-energy radiation in such doses that the solubility of the layer, especially in water and aqueous solutions, increases in the irradiated areas, and the irradiated areas are then removed by means of a developer solution. The compound (2) is a compound which contains at least one carboxylic ortho acid ester group and-/or amide acetal group, or a compound which contains at least one bond capable of being split by an acid and corresponding to the general formula

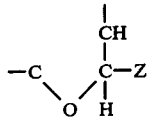

wherein Z is the radical —OAr, or —NRSO₂Ar, or the groups

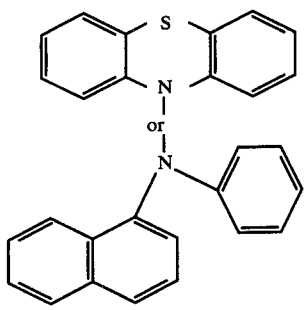

wherein Ar is a monovalent or bivalent aromatic group and R is a lower alkyl group.

The above-mentioned acetal and aminal compounds are described in detail in German Offenlegungsschrift No. 2,306,248.

In addition to the known photolytic acid-donors sensitive to light within the visible and near UV range, also those compounds may be used as initiators for the electron beam recording process according to the invention which have their absorption ranges within the short-wave range of the electro-magnetic spectrum and thus are less sensitive to daylight. This has the advantage that the recording material of the invention need not be handled in the absence of light and that the shelf-life of the materials may be improved.

The following compounds are examples of such initiators: tribromo-methyl-phenyl-sulfone, 2,2',4,4',6,6'-hexabromo-diphenyl-amine, pentabromo-ethane, 2,3,4,5-tetrachloro-aniline, pentaerythritol-tetra-bromide, "Clophenharz W", i.e., a chloroterphenyl resin, and chlorinated paraffins.

In the following, copying compositions according to the invention will be described as examples. First, the preparation of a series of new ortho esters and carboxylic acid amide acetals wil be described which were found to be suitable for use in the copying compositions according to the invention as compounds capable of being split by acids. They were numbered compounds Nos. 1 to 103 and will be referred to by these numbers in the examples. The relation between parts by weight (p.b.w.) and parts by volume (p.b.v.) corresponds to the relation between grams and milliliters. Percentages and proportions refer to units by weight unless stated otherwise.

Some of the compounds which are capable of splitting and forming an acid upon irradiation are new. The compounds in question are certain substituted 6-tri-chloro-methyl-2-pyrones. Substantially all of these compounds are prepared according to the following reaction pattern by analogy to known compounds:

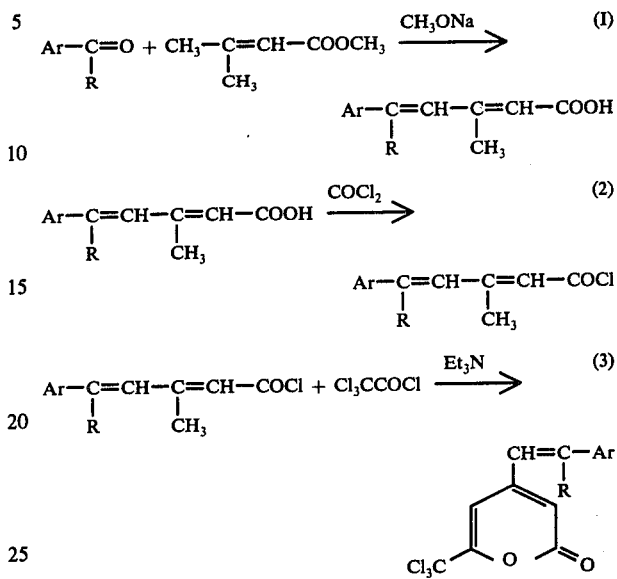

The pyrone derivatives thus produced may be used either as such or after halogenation by reaction with sulfuryl chloride, chlorine or bromine, the halogen atom entering the molecule in a position which is not exactly defined. The after-halogenated pyrones also may be used as acid-yielding initiators. Details of the preparation of such a compound are described in Example 30. The other compounds may be prepared analogously without difficulty; if necessary, the vinylogous aromatic carbonyl compounds may be used as starting materials in the first stage.

General Prescription for the Preparation of Compounds 1 to 32 Listed in Tables 1 to 4

10 g of diphenoxy chloromethane dissolved in 50 ml of anhydrous methylene chloride or a 1:1 mixture of methylene chloride and diethylether are mixed drop by drop, while agitating with 6.5 ml of triethyl amine in 10 ml of anhydrous methylene chloride at a temperature between 5° and 15° C. In principle, it is also possible to use other solvents which do not undergo an irreversible reaction with the reactants under the conditions of the reaction, e.g., tetrahydrofuran, dioxane, acetone, ethyl acetate, 1,2-dimethoxy-ethane, and 1,2-dichloroethane. 0.04 molar equivalents of the hydroxyl component are added to the mixture and the mixture is then stirred for from 2 to 24 hours at room temperature. Alternatively, it is also possible to add a solution of diphenoxy chloromethane dropwise to a mixture of the hydroxyl component and triethyl amine. When the reaction is substantially completed, as can be observed by a thin-layer chromatograhic process, the reaction mixture is twice washed with 50 ml of water, the organic phase is dried over sodium sulfate, and is then evaporated at reduced pressure. The crude product is recrystallized from a suitable solvent (Method a).

Processing Method b comprises washing the organic phase twice with 10 ml each of 15 per cent sodium hydroxide solution, washing it three times with water, and then drying and evaporating it. According to Method c, the crude product is subjected to a chromatographic process in a column of silica gel, using methylene chloride as the eluant, and according to Method d the crude product is reprecipitated from methanol at −30° C.

Table I

Compounds of the general formula
(Ph = phenyl)

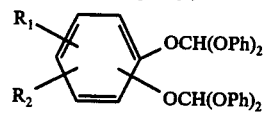

| Compound No. | $R_1$ | $R_2$ | Positions of —OCH(OPh)$_2$ | Melting Pt. (° C) | Yield (% of the theoretical) | Method |
|---|---|---|---|---|---|---|
| 1 | H | H | 1.3 | 101 – 102.5 | 73 | a |
| 2 | 4-tert-C$_4$H$_9$ | H | 1.2 | 88 – 89 | 80 | a |
| 3 | 4-COCH$_3$ | H | 1.3 | Oil | 99 | b |
| 4 | 4-CO—n-C$_4$H$_9$ | H | 1.3 | Oil | 99 | b |
| 5 | 4-COPh | H | 1.3 | Oil | 64 | c |
| 6 | 4-COOCH$_3$ | H | 1.3 | Oil | 79 | d |
| 7 | 5-COO—i-C$_5$H$_{11}$ | H | 1.3 | 68 – 69 | 61 | a |
| 8 | 5-OCH(OPh)$_2$ | H | 1.3 | 114.5 – 116 | 83 | a |
| 9 | 4-COPh | 3-OCH(OPh)$_2$ | 1.2 | 102 – 103 | 92 | c,a |
| 10 | 4-n-C$_6$H$_{13}$ | H | 1.3 | Oil | 99 | b |
| 11 | 4-COO—i-C$_5$H$_{11}$ | H | 1.3 | Oil | 99 | b |
| 12 | 4-NO$_2$ | H | 1.3 | 63 – 64 | 80 | a |

Table 2

Compounds of the general formula

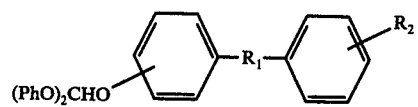

| Compound No. | Positions of —OCH(OPh)$_2$ | Melting Point (° C) | Yield (% of the theoretical) | Method |
|---|---|---|---|---|
| 13 | 1.4 | 119.5 – 120.5 | 56 | a |
| 14 | 1.5 | 183.5 – 184.5 | 86 | a |
| 15 | 1.6 | 122.5 – 123.5 | 66 | a |
| 16 | 1.7 | 93.5 – 95 | 76 | a |
| 17 | 1.8 | 84 – 85 | 51 | a +) |
| 18 | 2.3 | 121.5 – 123 | 70 | a |
| 19 | 2.6 | 179.5 – 182 | 81 | a |
| 20 | 2.7 | 97 – 98.5 | 78 | a |

+) In this case, the reaction time was 96 hours.

Table 3

Compounds of the general formula

| Compound No. | $R_1$ | $R_2$ | Position of —OCH(OPh)$_2$ | Melting Pt. (° C) | Yield (% of the theoretical) | Method |
|---|---|---|---|---|---|---|
| 21 | CH$_3$—C(CH$_3$)— | H | 4 | 78 – 79.5 | 80 | a |
| 22 | CH$_3$—C(CH$_3$)— | 4'-OCH(OPh)$_2$ | 4 | 95 – 96.5 | 91 | a |
| 23 | —SO$_2$— | 4'-OCH(OPh)$_2$ | 4 | 108 – 109 | 94 | a |
| 24 | CH$_3$—C[(CH$_2$)$_2$COOC$_2$H$_5$]— | 4'-OCH(OPh)$_2$ | 4 | 139 – 141 | 91 | a |
| 25 | CH$_3$—C[(CH$_2$)$_2$COOH]— | 4'-OCH(OPh)$_2$ | 4 | 143 – 144 | 91 | +) |
| 26 | CH$_3$—C[(CH$_2$)$_2$COOCH(OPh)$_2$]— | 4'-OCH(OPh)$_2$ | 4 | 83.5 – 83.5 | 95 | a |
| 27 | —O—(CH$_2$)$_4$—O— | 3'-OCH(OPh)$_2$ | 3 | Oil | 92 | b |

+) Compound No. 25 was prepared from Compound No. 26, by heating a solution of Compound No. 26 in ethanol for 15 hours with reflux, distilling the solvent off under reduced pressure, and recrystallizing the resulting compound from ethyl acetate

| Compound No. | Compound | 1H-NMR (—O)$_3$CH δ(ppm), CDCl$_3$(TMS) | Yield (% of the theoretical) | Method |
|---|---|---|---|---|
| 28 | (PhO)$_2$CHO(CH$_2$)$_{11}$CH$_3$ | 6.24 | 90 | b |
| 29 | (PhO)$_2$CHO(CH$_2$)$_{12}$OCH(OPh)$_2$ | 6.24 | 94 | b |
| 30 | Ph—[cyclic structure with O, O, OCH(OPh)$_2$, C$_2$H$_5$] | 6.30 | 97 | b |
| 31 | [cyclic structure with O, O, OCH(OPh)$_2$, C$_2$H$_5$] | 6.25 | 96 | b |
| 32 | [p-H$_3$CO—Ph—]$_2$CHOCH(OPh)$_2$ | 6.22 | 94 | b |

Compound No. 33

16 g of 2-naphthol were dissolved in 55 ml of a solution of sodium ethylate in 2 N-ethanol. Under reduced pressure the solvent was distilled off, the residue was dried under high vacuum, then suspended in 50 ml of 1,2-dimethoxy ethane, and nitrogen was superposed on the liquid. While the suspension was agitated, 8.9 g of phenyl dichloromethyl ether (Rec. Trav. Chim. 90, 556, 1971) were added dropwise, and the suspension was then heated for 30 minutes with reflux, and the solvent was removed under reduced pressure. The residue was subjected to partition in water and methylene chloride and the organic phase was washed with 15 per cent sodium hydroxide solution and water, dried over sodium sulfate, and evaporated under reduced pressure. The residue was dissolved in 15 ml of ether and then mixed drop-wise with 45 ml of ethanol. 10.74 g (55 per cent of theoretical) of dinaphthoxyphenoxy-methane (Compound No. 33) were obtained in the form of crystals which melted at 88.5° – 90° C. After recrystallization from an ether/ethanol mixture, the compound had a melting point of 90.5° – 91.5° C.

Compound No. 34

In a nitrogen atmosphere, 22.4 g of sodium-4-(2-phenyl-prop-2-yl)-phenolate in 50 ml of dimethyl formamide were mixed dropwise while agitating with 8.36 g of phenyl dichloro methyl ether. After 3.5 hours at room temperature the mixture was poured onto 500 ml of ice and water and twice absorbed in 200 ml of other each. The organic substance suspended in the ether phase was drawn off and recrystallized from a methylene chloride/ethanol mixture. 3.85 g (13 per cent of theoretical) of tris-4-(2-phenyl-prop-2-yl)-phenoxy-methane (Compound No. 34 A) were thus obtained, with a melting point of 166°–167° C. The ether filtrate was washed with 15 per cent sodium hydroxide solution and water, dried over sodium sulfate, and evaporated. The residue was dissolved in methylene chloride and filtered over silica gel (0.05 - 0.2 mm). The substance obtained from the medium fractions (11.6 g. 70 per cent of the original quantity) was crystallized in fractions from a mixture of ether and ethanol. 5.1 g (20 per cent of theoretical) of phenoxy-bis-4-(2-phenyl-prop-2-yl)-phenoxy-methane (Compound No. 34 B) were thus obtained which melts at 110° – 111° C.

Compound No. 35

52 g of n-decanol, 10.8 g of ortho-formic acid trimethyl ester, and 300 mg of p-toluene sulfonic acid were heated for 15 hours with agitation and the temperature of the heating bath was slowly increased from 100° to 140° C during this time. 8.8 g of a distillate which contained 91 per cent of methanol was collected. The reaction mixture was allowed to cool and then mixed with 1.5 g of anhydrous potassium carbonate and filtered. The filtrate was distilled in a bulbed tube apparatus. At a temperature of 185° – 205° C of the air bath and a pressure of 0.002 mm Hg, 14.42 g of a fraction distilled over which consisted of ortho-formic acid-tri-n-decyl ester (Compound No. 35).

$^1$H-NMR (CDCl$_3$, TMS) : δ = 5.15 ppm [(—O)$_3$CH].

Compound No. 36

58 g of n-dodecanol, 10.8 g of o-formic acid trimethyl ester, and 300 mg of p-toluene sulfonic acid were heated for 42 hours with agitation while the temperature of the heating bath was slowly raised from 115° to 160° C. 6.5 g of a distillate containing 94 percent of methanol was collected. The reaction mixture was allowed to cool and was then mixed with 0.5 g of anhydrous potassium carbonate and filtered. The filtrate was distilled in a bulbed tube apparatus. A fraction of 17.8 g which distilled over at a temperature of the air bath of 240° to 250° C and a pressure of 0.007 mm Hg consisted of ortho-formic acid-tri-n-dodecyl ester (Compound No. 36). $^1$H-NMR (CDCl$_3$, TMS) : δ = 5.16 ppm [(—O)$_3$CH].

Compound No. 37

160.3 g of 2-ethyl-2-butyl-1,3-propane diol, 72 g of ortho-formic acid-trimethyl ester, and 650 mg of p-toluene sulfonic acid were heated for 5 hours with agitation while the temperature of the bath was slowly raised from 100° to 165° C. Over an attached 20 cm Vigreux column, 60.2 g of methanol were distilled off. After cooling, the reaction mixture was mixed up with 100 ml of ether and 2.4 g of anhydrous potassium carbonate, filtered, and the filtrate was distilled in a bulbed tube apparatus. At an air bath temperature between 180° and 200° C and a pressure of 0.005 mm Hg, a fraction of 130 g distilled over which was distilled again. At an air bath temperature between 180° and 185° C and a pressure of 0.005 mm Hg, 114.6 g of 1,3-di-[2-(5-ethyl-5-butyl-1,3-dioxy cyclohexoxy)]-2-ethyl-2-butyl-propane were obtained (Compound No. 37).

$^1$H-NMR (CDCl$_3$, TMS) : δ = 5.26 ppm [(—O)$_3$CH].

Compound No. 38

28 g of 2-ethyl-2-butyl-1,3-propane diol, 19.3 g of ortho-acetic acid-tri-ethyl ester, and 150 mg of p-toluene sulfonic acid were heated for 7 hours while agitating and while gradually raising the bath temperature from 125° to 160° C. 12.92 g of ethanol were distilled off. After cooling, the reaction mixture was mixed with 300 mg of potassium carbonate and 50 ml of ether, filtered, and the filtrate was distilled three times in a bulbed tube apparatus. The fraction which finally distilled over at an air bath temperature of 185° C and a pressure of 0.0005 mm Hg consisted of 1,3-di-[2-(5-ethyl-5-butyl-2-methyl-1,3-dioxa-cyclohexoxy)]-2-ethyl-2-butyl-propane (Compound No. 38).

$^1$H-NMR (CDCl$_3$, TMS) : $\delta$ = 3.17 − 402 ppm, AB-spectrum + S, (—CH$_2$—O—).

General Preparation of Compounds 39 to 49

7.5 g of diphenoxy chloromethane dissolved in 10 ml of methylene chloride are dropwise addred to a solution of 15 millimoles of diol and 4.9 ml of triethyl amine in 30 ml of methylene chloride while agitating and cooling. The reaction mixture is allowed to stand overnight at room temperature and is then washed, twice with 15 ml of water, twice with 15 ml of 15 per cent sodium hydroxide solution, and then five times with 15 ml of water. Then, it is dried over sodium sulfate and freed from the solvent under reduced pressure. With the exception of the ethylene glycol reaction product which is crystallized from ether to which ethanol is added, the crude products are directly analyzed. The $^1$H-NMR signal (CDCl$_3$) of the diphenoxy-methyl protons [(—O)$_3$CH] is found in all cases within the calculated integration ratio in the range $\delta$ = 6.28 − 6.31. The IR spectra do not indicate any hydroxyl groups.

Compound No. 39

Ethyleneglycol-bis-diphenoxy-methyl ether (melting point 74.5° − 75.5° C). Yield: 91 per cent of theoretical.

Compound No. 40

Diethyleneglycol-bis-diphenoxy-methyl ether. Yield: 98 per cent of theoretical.

Compound No. 41

Triethylene-glycol-bis-diphenoxy-methylether. Yield: 94 per cent of theoretical.

Compound No. 42

Tetraethyleneglycol-bis-diphenoxy-methyl ether. Yield: 99 per cent of theoretical.

Compound No. 43

Pentaethyleneglycol-bis-diphenoxy-methyl ether. Yield: 99 per cent of theoretical.

Compound No. 44

Etherification of polyglycol 200 with diphenoxy-chloromethane.

Quantity used: 3 g of polyglycol 200 with a hydroxyl value of 562.

Yield: 8.74 g (99 per cent of theoretical).

Compound No. 45

Etherification of polyglycol 300 with diphenoxy chloromethane.

Quantity used: 4.5 g of polyglycol 300 with a hydroxyl value of 366.

Yield: 10.25 g (97 per cent of theoretical).

Compound No. 46

Etherification of polyglycol 400 with diphenoxy chloromethane.

Quantity used: 6.3 g of polyglycol 400 with a hydroxyl value of 270.

Yield: 11.85 g (96 per cent of theoretical).

Compound No. 47

Etherification of polyglycol 500 with diphenoxy chloromethane.

Quantity used: 7.43 g of polyglycol 500 with a hydroxyl value of 227.

Yield: 13.11 g (98 per cent of theoretical).

Compound No. 48

Etherification of polyglycol 600 with diphenoxy chloromethane. Quantity used: 9.03 g of polyglycol 600 with a hydroxyl value of 186.

Yield: 14.75 g (98.6 per cent of theoretical).

Compound No. 49

Etherification of polyglycol 1000 with diphenoxy chloromethane.

Quantity used: 15.45 g. of polyglycol 1000 with a hydroxyl value of 107.

Yield: 21.33 g (99.6 per cent of theoretical).

Compound No. 50

While agitating and cooling, 5 g of diphenoxy chloromethane dissolved in 5 ml of methylene chloride were added dropwise to 4.12 g of triethylene glycol monobutyl ether and 3.3 ml of triethyl amine in 35 ml of methylene chloride. The reaction mixture was allowed to stand overnight at room temperature and was then washed, twice with 15 ml of water each, three times with 15 ml of 15 per cent sodium hydroxide solution each, and three times with 15 ml of water. The organic phase was dried over sodium sulfate and was then freed from the solvent under reduced pressure. 7.76 g (96 per cent of theoretical) of triethyleneglycol-butyl-diphenoxy methyl ether (Compound No. 50) were obtained in the form of an oily residue.

$^1$H-NMR (CDCl$_3$, TMS) : $\delta$ =6.46 ppm (—O)$_3$CH.

Compound No. 51

This compound was prepared analogously to the preparation of Compound No. 50, using 1.66 g of terephthalic acid instead of triethylene glycol monobutyl ether for the reaction and processing the mixture after 6.5 hours. The crude product crystallized from ether. Yield: 4.43 g (77 per cent of theoretical) of terephthalic acid-bis-diphenoxy methyl ester with a melting point of 96° − 97° C (Compound No. 51).

Compound No. 52

This compound was prepared analogously to the preparation of Compound No. 50, using 2.7 g of benzoic acid methyl amide in 20 ml of methylene chloride instead of triethylene glycol monobutyl ether for the reaction and processing the mixture after three days. The crude product was dissolved in methylene chloride and freed from impurities by filtration over silica gel. 3.7 g (56 per cent of the theoretical) of the oil N-methyl- N-diphenoxy-methyl-benzoic acid amide (Compound No. 52) were obtained.

IR (CH$_2$Cl$_2$) ; 1653 cm$^{-1}$ (amide carbonyl).

Compound No. 53

The compound was prepared analogously to the preparation of Compound No. 50, using 3.42 g of benzene sulfonic acid methyl amide instead of triethylene glycol monobutyl ether and processing the mixture after four days. The crude product was subjected to a chromatographic process in a column of silical gel (0.05 to 0.2 mm), using methylene chloride as the eluant. The first fractions, which contained only one main product, were united and recrystallized from ether. Yield: 2.85 g (39 per cent of theoretical).

N-methyl-N-diphenoxy methyl-benzene sulfonamide with a melting point of 96°–97.5° C (Compound No. 53).

Compound No. 54

93 g of tartaric acid diethyl ester, 65 g of ortho-formic acid trimethyl ester, and 0.3 g of p-toluene sulfonic acid were heated while stirring and slowly raising the reaction temperature from 92° to 141° C during 2.5 hours. 36.8 g of a distillate, mostly methanol, were removed by means of a 20 cm Vigreux column. The reaction mixture was neutralized by adding 1.5 g of potassium carbonate and was then distilled. Yield: 96.3 g (86 per cent of theoretical) of 4,5-dicarboethoxy-2-methoxy-1,3-dioxolane with a boiling point of 99° – 102° C at a pressure of 0.01 mm Hg. 30 g of this compound were stirred for 11 hours and a temperature between 70° and 125° C with 7.5 g of triethylene glycol and 100 mg of p-toluene sulfonic acid under a waterjet vacuum. 2.7 g of a distillate, mostly methanol, were collected in an interposed cooling trap. The reaction mixture was neutralized by adding 300 mg of potassium carbonate, filtered, and distilled in a bulbed tube apparatus until only 230 mg of a distillate distilled over during three hours at a pressure of 0.005 mm Hg and an air bath temperature of 125° C. According to the $^1$H-NMR-spectrum (CDCl$_3$, TMS), the residue, (21.8 g of an oil) consisting preponderantly of triethylene glycol-bis-4,5-dicarboethoxy-1,3-dioxolan-2-yl-ether, $\delta$ = 6.16 ppm (2-H) (Compound No. 54).

Compound No. 55

15 g of 2-methoxy-1,3-dioxolane, 12.3 g of a distillation fraction which was obtained from polyglycol 200, had a hydroxyl content of 13.85 per cent, and contained 84 per cent of penta-ethylene glycol, and 100 mg of p-toluene sulfonic acid were agitated for six hours while slowly raising the temperature from 82° to 128° C. 1.83 g of methanol were distilled off.

The reaction mixture was mixed with 300 mg of potassium carbonate, filtered, and then freed in a bulbed tube apparatus from readily volatile components until, finally, only 680 mg of a distillate distilled over during 2 hours at an air bath temperature of 150° C and a pressure of 0.01 mm Hg. According to the $^1$H-NMR spectrum (CDCl$_3$, TMS), the oily residue (16.5 g) consisting mainly of a mixture of polyglycols etherified at both ends with 1,3-dioxolan-2-yl residues (Compound No. 55) ($\delta$ = 5.89 ppm, 2-H).

Compound No. 56

32 g of 2-ethyl-2-butyl-1,3-propane diol, 45 g of orthopropionic acid-triethyl ester, and 150 mg of p-toluene sulfonic acid were heated during 3.5 hours from 80° to 105° C under a water-jet vacuum, then mixed with 450 mg of potassium carbonate, filtered, and distilled over a Vigreux column of 20 cm. 39 g (80% of theoretical) of 2-ethoxy-2,5-diethyl-5-butyl-1,3-dioxane with a boiling point of 59° – 60° C at a pressure of 0.002 mm Hg (Compound No. 56) were thus obtained.

Compound No. 57

50 g of ortho-benzoic acid triethyl ester were reacted analogously to the method used for the preparation of Compound No. 56. 43.0 g (74 percent of theoretical) of 2-ethoxy-5-ethyl-5-butyl-2-phenyl-1,3-dioxane with a boiling point of 81° – 83° C at a pressure of 0.001 mm Hg were thus obtained (Compound No. 57).

Compound No. 58

10.3 g of triethylene glycol monobutyl ether, 14.0 g of 2-ethoxy-2,5-diethyl-5-butyl-1,3-dioxane, and 40 mg of p-toluene sulfonic acid were heated for 3 hours under a water-jet vacuum, while the temperature was raised from 70° to 110° C, then mixed with 120 mg of potassium carbonate, filtered, and distilled in a bulbed tube apparatus. The fraction (16.7 g, 83 per cent of theoretical) distilling over at an air bath temperature of 148° – 158° C and a pressure of 0.001 mm Hg consisted of triethylene glycol butyl-(2,5-diethyl-5-butyl-1,3-dioxacyclohex-2-yl)-ether (Compound No. 58).

Compound No. 59

6.0 g of triethylene-glycol monobutyl ether, 7.3 g of 2-ethoxy-5-ethyl-5-butyl-2-phenyl-1,3-dioxane, and 20 mg of p-toluene-sulfonic acid were heated to 112° C for 4.5 hours under a water-jet vacuum, then mixed with 60 mg of potassium carbonate, filtered, and distilled in a bulbed tube apparatus. The fraction distilling over at an air bath temperature of 175° – 190° C and a pressure of 0.003 mm Hg (8.74 g = 77 per cent of theoretical) consisted of triethyleneglycol-butyl-(5-ethyl-5-butyl-2-phenyl-1,3-dioxacyclohex-2-yl)-ether (Compound No. 59).

Compound No. 60

3 g of triethyleneglycol, 10.8 g of 2-ethoxy-2,5-diethyl-5-butyl-1,3-dioxane, and 30 mg of p-toluene sulfonic acid were heated for 3 hours and 20 minutes to 100° C while agitating and under a water-jet vacuum, then mixed first with 90 mg of potassium carbonate, then with 25 ml of benzene, and twice extracted with 10 ml of water each. The organic phase was dried over sodium sulfate, freed from solvent in a vacuum, and heated in a bulbed tube apparatus at an air bath temperature of 120° C and a pressure of 0.003 mm Hg. During 1 hour, 900 mg of distillate were obtained. The residue weighed 10.8 g (99 percent of theoretical) and consisted of triethyleneglycol-bis-(2,5-diethyl-5-butyl-1,3-dioxacyclohex-2-yl)-ether (Compound No. 60).

Compound No. 61

12.9 g of 2-ethoxy-5-ethyl-5-butyl-2-phenyl-1,3-dioxane were reacted analogously to the preparation of the Compound No. 60. 12 g (98 per cent of theoretical) of triethyleneglycol-bis-(5-ethyl-5-butyl-2-phenyl-1,3-dioxacyclohex-2-yl)-ether were obtained (Compound No. 61).

Compound No. 62

5.4 g of ortho-formic acid-trimethyl ester, 33 g of triethyleneglycol monobutyl ether, and 50 mg of p-toluene sulfonic acid were heated to 142° C, first for 7 hours at standard pressure and then for 2 hours under a water-jet vacuum. 2.48 g of methanol were distilled off. The reaction mixture was mixed with 150 mg of potassium carbonate, filtered, and distilled in a bulbed tube apparatus at an air bath temperature of 143° – 145° C and a pressure of 0.01 mm Hg until only 0.1 g of distillate were obtained during 1 hour.

In an IR spectrum (CH$_2$Cl$_2$), the oily residue (20 g = 62 per cent of theoretical) showed no OH absorption and an intensive, wide band at about 1100 cm$^{-1}$. It consisted mainly of ortho-formic acid-tris-3,6,9-trioxatridec-1-yl-ester (Compound No. 62).

Compound No. 63

10.6 g of 4-cumyl-phenol and 100 g of o-formic acid triethyl ester were agitated for 17 hours while the temperature was raised from 100° to 135° C and 4.7 g of ethanol distilled off. Excess orthoformic acid triethyl ester was evaporated under reduced pressure and the residue was distilled in a bulbed tube apparatus.

At an air bath temperature of 150° C and a pressure of 0.009 mm Hg 7.32 g (46 per cent of theoretical) of diethoxy methyl-4-cumylphenyl-ether (Compound No. 63) were obtained which, according to the $^1$H-NMR-spectrum [$\delta$ = 5.70 ppm; (—O)$_3$CH] contained only very little impurities.

Compound No. 64

11.4 g of bisphenol A were reacted with ortho-formic acid triethyl ester analogously to the preparation of Compound No. 63. The crude product freed from excess o-formic acid triethyl ester at a temperature of 50° C and a pressure of 0.1 mm Hg consisted mainly of the bis-diethoxy methyl ether of bisphenol A and weighed 20.93 g. The resulting Compound No. 64 shows only a very weak OH-absorption at 3560 cm$^{-1}$ in the IR spectrum (CH$_2$Cl$_2$), as compared with the free bisphenol A, but very intensive bands at 1040 cm$^{-1}$ and 1100 cm$^{-1}$.

Compound No. 65

This compound was prepared analogously to the preparation of Compound No. 51, but instead of terephthalic acid, 2.44 g of benzoic acid were reacted and the reaction mixture was processed after two hours. The crude product was crystallized from pentane. 4.12 g (60 per cent of theoretical) of benzoic acid diphenoxy methyl ester (Compound No. 65) were obtained. Melting point: 41.5° –42.5° C.

Compound No. 66

By the method described for the preparation of Compound No. 60, 12.9 g of 5-ethyl-5-butyl-2-cyclohexyl-2-methoxy-1,3-dioxane (boiling point 102° C at 0.01 mm Hg) obtained from 2-ethyl-2-butyl-1,3-propane diol and cyclohexane ortho-carboxylic acid trimethyl ester were reacted with triethyleneglycol. 14.2 g of a product were obtained which consisted mainly of triethylene glycol-bis-(5-ethyl-5-butyl-2-cyclohexyl-1,3-dioxan-2-yl-ether (Compound No. 66) and which showed no OH absorption and a very weak carbonyl absorption in an IR spectrum (CH$_2$Cl$_2$).

Compound No. 67

Analogously to the preparation of Compound No. 60, 25 g of 5-ethyl-5-butyl-2-methoxy-1,3-dioxane (boiling point 55° – 56° C at 0.002 mm Hg) obtained from 2-ethyl-2-butyl-1,3-propane diol and o-formic acid trimethyl ester were reacted with a distillation fraction of polyglycol 200 which had a hydroxyl content of 13.85 per cent and contained 84 per cent of penta-ethylene glycol. The crude product was neutralized by adding 300 mg of potassium carbonate and was then heated in a bulbed tube apparatus until only 100 mg of distillate distilled over during one hour at an air bath temperature of 115° C and a pressure of 0.0007 mm Hg. 30.4 g of a product were obtained which consisted mainly of the bis-5-ethyl-5-butyl-1,3-dioxan-2-yl-ether of penta-ethylene glycol (Compound No. 67) and which showed no hydroxyl or carbonyl absorptions in an IR spectrum (CH$_2$Cl$_2$).

Compound No. 68

2.1 g of 2-methoxy-hydroquinone were reacted analogously to the method used for the preparation of Compounds Nos. 39 to 49. The crude product was purified by dissolving it in methylene chloride and filtering it over silica gel. 7.46 g (93 per cent of theoretical) of oily 1,4-bis-diphenoxy-methoxy-2-methoxy-benzene were obtained. The IR spectrum (CH$_2$Cl$_2$) of the compound was free from hydroxyl and carbonyl absorptions (Compound No. 68).

Compound No. 69

3.88 g of 9-hydroxy-anthracene were reacted and processed analogously to the method used for the preparation of Compound No. 50. The reaction time was 4 days. The crude product was dissolved in methylene chloride and subjected to a chromatographic process over silica gel. 4.03 g (51 per cent of theoretical) of 9-diphenoxymethoxy-anthracene were obtained which had a melting point of 90° to 92° C after recrystallization from ether (Compound No. 69).

Compound No. 70

20.4 g of 2,2,5,5,-tetramethylol-cyclopentanone, 31.8 g of ortho-formic acid-trimethyl ester, and 150 mg of p-toluene-sulfonic acid were agitated for 2 hours while slowly raising the temperature from 78° to 122° C. 14.9 g of a mixture of methanol and a small quantity of o-formic acid-triethyl ester were distilled off over an attached Vigreux column of 20 cm. After neutralization of the mixture with 0.5 g of potassium carbonate, dilution with methylene chloride, filtration, and evaporation of the filtrate under reduced pressure, 33.27 g of a viscous oil resulted which was heated for 2 hours at 200° C at a pressure of 1.8 -0.5 mm Hg. 24.8 g of a brittle, colorless resin were thus obtained which showed an intensive o-ester absorpiton band at 1080 cm$^{-1}$ in the IR spectrum (CH$_2$Cl$_2$) (Compound No. 70).

General Instructions for the Preparation of Compounds Nos. 71 to 84

5 g of diphenoxy chloromethane in 5 ml of anhydrous methylene chloride are added drop by drop, while agitating, to a solution of 0.02 mole of a secondary nitrogen compound of the general formula

and 3.3 ml of triethyl amine in 25 ml of anhydrous methylene chloride with the exclusion of moisture. During the introduction of this solution, the reaction mixture is maintained at a temperature between about 5° and 15° C by cooling and then kept standing at room temperature until the reaction is substantially completed by the rules of thin-layer chromatographic processes (normally after 2 to 24 hours). The mixture is shaken, first with 20 ml of water, then with 20 ml of 15 per cent sodium hydroxide solution, and then again with 20 ml of water, subsequently dried over sodium sulfate, and evaporated under reduced pressure. The crude product is either directly crystallized from the solvent used (Method a), or, where possible, after previous cleaning by a chromatographic process in a column of silica gel, using methylene chloride and 1 per cent of triethyl amine as the eluant. The N-diphenoxy-methyl derivatives listed in Table 7 are thus obtained.

Compounds Nos. 86-89

The compounds are prepared analogously to the preparation of Compounds Nos. 71-84, but instead of the secondary nitrogen compound, 0.02 mole of
(a) cyclohexanone oxime,
(b) α-benzaldehyde oxime,
(c) β-benzaldehyde oxime, and
(d) benzophenone oxime
are reacted in each case with 5 g of diphenoxy chloro- Table 7

Compounds of the general formula R₂N—CH(OPh)₂ (Ph = phenyl)

| Compound No. | R | Melting Point (° C) | Recrystallized from the following solvent: | Yield (% of theoretical) | Method |
|---|---|---|---|---|---|
| 71 | —CH(CH₃)—CH₂—CO— | 57 – 60 | pentane | 50 | b |
| 72 | —(CH₂)₃—CO— | 50 – 52.5 | methanol/water | 57 | b |
| 73 | —CH₂—CH(Ph)—CH₂—CO— | 92 – 94 | methanol | 72 | a |
| 74 | —(CH₂)₅—CO— | 86 – 88 | methanol | 71 | a |
| 75 | —(CH₂)₁₁—CO— | 69 – 72 | methanol | 50 | b[1)] |
| 76 | —OC—(CH₂)₂—CO— | 78.5 – 80 | ether | 45 | a |
| 77 | —OC—CH=CH—CO— | oil | — | 16 | b |
| 78 | (phthaloyl: o-C₆H₄(CO—)₂) | 137 – 139 | ethylacetate | 89 | a |
| 79 | (tetrachlorophthaloyl) | 172.5 – 175 | ethanol/ethylacetate | 47 | a |
| 80 | (cyclohex-4-ene-1,2-dicarbonyl) | 110 – 111.5 | ether | 72 | a |
| 81 | (phthalic anhydride-type: o-C₆H₄(CO)₂O) | 125 – 127 | ether | 13 | a[2)] |
| 82 | (phenothiazine-type, S-bridge) | 146 – 148.5 | ether | 63 | a |
| 83 | (carbazole / diphenylamine-type) | 97 – 98.5 | ether/ethanol | 60 | a[3)] |
| 84 | (benzisoxazoline-type with N=CH) | 120 – 122.5 | ether | 61 | a |

Reaction Times:
[1)] 14 days
[2)] 5 days
[3)] 40 days

Compound No. 85

Analogously to the preparation of Compounds Nos. 71-84, 3.93 g of benzaldehyde phenyl hydrazone are reacted with 5 g of diphenoxy chloromethane and processed after 5 days according to Method a. After recrystallization of the crude product from di-isopropyl ether, 4.2 g (53% of theoretical) of benzaldehyde-N-diphenoxy-methyl-N-phenyl-hydrazone with a melting point of 126°–128.5° C is obtained.

methane. By a thin-layer chromatographic process (silica gel plates, 9:1 mixture of toluene and acetone as the eluant), practically uniform, oily crude products are obtained, viz. the following diphenoxy-methyloxime ethers: (a) Compound No. 86 (yield: 77% of theoretical), (b) Compound No. 87 (yield: 92% of theoretical), (c) Compound No. 88 (yield: 86% of theoretical), and d) the o-diphenoxy-methyl-benzophenone-oxime designated as Compound No. 89 (yield: 76% of theoretical) which is obtained by recrystallization of the crude product from ether and has a melting point of 89°–90° C.

Compounds Nos. 90-94

The diphenoxy methyl ethers listed in Table 8 below are prepared analogously to the preparation of Compounds Nos. 71-84, by reacting 0.02 mole of the monohydroxy compound or 0.01 mole of the dihydroxy compound with 5 g of diphenoxy chloromethane.

Table 8

| Compound No. | |
|---|---|
| 90 | 3-diphenoxy-methoxy-2-methyl-cyclohex-2-ene-1-one; melting point 56–58° C (from diisopropyl ether); yield: 67% of theoretical. |
| 91 | 4-diphenoxy-methoxy-benzoic acid-3,6,9-trioxa-n-tridecyl-(1)-ester; oil; yield: 45% of theoretical (after chromatographic process using a silica gel column). |
| 92 | 1-diphenoxy-methoxy-2,6-dimethyl-benzene; oil; yield: 97% of theoretical. |
| 93 | 8-diphenoxy-methoxy-quinoline; melting point 80 – 82.5° C (from ethyl acetate); yield: 83% of theoretical. |
| 94 | tetrachloro-1,4-bis-diphenoxy-methoxy-benzene; melting point 104 – 106° C (from ether/ethanol); yield: 84% of theoretical. |

The starting material for the Compound No. 91, 4-hydroxybenzoic acid-3,6,9-trioxa-n-tridecyl-(1)-ester, is prepared by esterification of benzoic acid with triethyleneglycol monobutyl ether.

Compound No. 95

25.4 g of 2-phenoxy-1,3-propane diol (J. Amer. Chem. Soc. 70, 3522, 1948), 11 g of o-formic acid trimethyl ester, and 100 mg of p-toluene sulfonic acid are heated for 5 hours with agitation, the temperature of the bath being gradually raised from 100° to 160° C. 6.43 g of methanol are distilled off through an attached Vigreux column of a length of 20 cm. After cooling, the reaction mixture is mixed with 50 ml of ether and 400 mg of anhydrous potassium carbonate, filtered, and the filtrate is then freed in a bulbed-tube apparatus from more readily volatile components until almost no substance distills over at an air bath temperature of 200° C and a pressure of 0.002 Torr. The residue is a viscous, almost colorless oil (11.2 g) which consists of 1,3-di-[2-(5-phenoxy-1,3-dioxa-cyclohexoxy)]-2-phenoxy-propane (Compound No. 95).

$^1$HNMR(CDCl$_3$, TMS) : $\delta$=5.33−5.57 ppm [(—O)$_3$CH]

Compound No. 96

7.2 g of the bis-orthoester dispiro-3,11-dimethoxy-2,4,10,12-tetraoxa-[5,1,5,2]-pentadecan-7-on with a melting point of 132°-133.5° C - prepared by reaction of 2,2,5,5-tetrahydroxymethyl-cyclopentanone with o-formic acid trimethyl ester in the presence of catalytic quantities of p-toluene sulfonic acid, followed by fractionated crystallization of the crude product from methanol -, 3.7 g of triethylene glycol, and 30 mg of p-toluene sulfonic acid are heated for 1 hour to a temperature between 105° and 115° C. After 0.87 g of methanol have been distilled off, a viscous resin is formed which is dissolved in 50 ml of methylene chloride, mixed with 0.5 g of potassium carbonate, filtered, and freed from solvent under reduced pressure. After drying in a high vacuum at 50° C, 10.59 g of the Compound No. 96 are obtained. A spectroscopic comparison, under infrared light, shows that 65 to 70 per cent of the hydroxy groups of the triethylene glycol used were converted into o-ester groups ($\nu_{max}$=1080 cm$^{-1}$; in CH$_2$Cl$_2$).

Compounds Nos. 97 to 99

2.5 g of diphenoxy chloromethane, in the form of a 30 per cent solution in methylene chloride, are cautiously added, with agitation, to
 (a) 4.2 g,
 (b) 6.25 g, and
 (c) 9.0 g of the novolak used in Example 2 in 25 ml of anhydrous dioxane and 1.7 ml of triethyl amine. The resulting mixtures are allowed to stand for 20 hours at 20° to 25° C, the overlying solutions are decanted from undissolved materials, diluted in each case with 100 ml of ethyl acetate, are then extracted five times with 50 ml of water each, dried over potassium sulfate, and finally evaporated under reduced pressure. The resulting resins, which contain diphenoxy methoxy groups, are obtained in the following quantities:
 (a) 4.37 g of Compound No. 97,
 (b) 7.05 g of Compound No. 98, and
 (c) 10.62 g of Compound No. 99.

Compounds Nos. 100 to 102

By analogy to the preparation of Compounds Nos. 97–99,
 (a) 9.0 g,
 (b) 11.4 g,
 (c) 15.7 g
of the novolak used in Example 1, dissolved in 50 ml of anhydrous ethyl acetate, is reacted each with 2.5 g of diphenoxy chloromethane in the presence of 1.7 ml of triethyl amine and the resulting crude products are processed as described for Compounds Nos. 97-99. The resulting, diphenoxy methoxy group-containing resins are obtained in the following quantities:
 (a) 6.07 g of Compound No. 100,
 (b) 6.98 g of Compound No. 101, and
 (c) 12.30 g of Compound No. 102.

Compound No. 103

1-phenoxy-2,3-propane-diol is converted into 2-methoxy-4-phenoxy-methyl-1,3-dioxolane (boiling point 93°-94° C at a pressure of 0.02 Torr; yield 89 per cent of theoretical), by analogy to the preparation of the dioxolane used as a starting material for Compound No. 54.

10.5 g of this compound, 3.36 g of 1-phenoxy-2,3-propane-diol, and 50 mg of p-toluene sulfonic acid are stirred for 2.5 hours while heating from 100° to 130° C and then stirred for another 2 hours at 130° C in a water-jet vacuum. 1.45 g of a distillate consisting mainly of methanol are collected in an attached cooling trap. The contents of the flask are treated with 50 ml of anhydrous methylene chloride and 0.5 g of potassium carbonate, the mixture is then filtered, and the filtrate is evaporated under reduced pressure. The residue is heated in a bulbed tube apparatus until no more distillate passes over in the course of 45 minutes at an air bath temperature of 130° C and a pressure of 0.001 Torr. 10.07 g of 1-phenoxy-2,3-bis-(4-phenoxymethyl-1,3-dioxacyclopent-2-yloxy)-propane (Compound No. 103, viscous oil, yield 96 per cent of theoretical) are thus obtained. An infrared spectrum (in CH$_2$Cl$_2$) showed no hydroxyl absorption.

EXAMPLE 1

For the manufacture of an offset printing form the following coating solution is prepared:
 94.6 p. b. w. of methyl ethyl ketone, 4.0 p. b. w. of phenol-formaldehyde novolak ("Alnovol PN 429"),
1.2 p. b. w. of Compound No. 4 (Table 1),
0.2 p. b. w. of naphthoquinone-(1,2)-diazide-(2)-4-sulfochloride,
0.01 p. b. w. of Crystal Violet.

An aluminum foil which had been mechanically roughened by dry brushing is coated with this solution on a whirler (150 revolutions per minute), a layer weighing about 1.5 to 2.0 g per square meter being produced. After the light-sensitive material has been sufficiently dried, it is exposed for 100 seconds under a positive line-halftone original, using a 5 kW metal-halide lamp at a distance of 140 cm, whereupon a strong bluish-green contrast becomes visible. The image is developed by spraying with the following developer solution:
5.5 per cent of sodium metasilicate . 9$H_2O$,
3.4 per cent of trisodium phosphate . 12 $H_2O$,
0.4 per cent of monosodium phosphate (anhydrous), and
90.7 per cent of distilled water.

The exposed areas of the layer are removed during 30 seconds and the blue-colored unexposed areas remain as the printing stencil. The offset printing plate produced in this manner then may be inked with greasy ink and used for printing, or it may be wiped over with a commercial preserver for later use.

EXAMPLE 2

A coating solution composed of
4.0 p. b. w. of phenol-formaldehyde novolak ("Alnovol PN 430"),
1.2 p. b. w. of Compound No. 21 (Table 3),
0.2 p. b. w. of 4-(4-methoxy-α-methyl-styrene)-6-trichloromethyl-2-pyrone (melting point: 140° C), and
0.01 p. b. w. of Crystal Violet in
94.6 p. b. w. of methyl ethyl ketone is used for roller-coating one side of an aluminum foil which had been mechanically roughened by wet brushing, the thickness of the layer being so adjusted that the dry layer weighs about 2.0 g per square meter. After 2 minutes' exposure under the conditions mentioned in Example 1, a distinctly visible image which is rich in contrast is obtained. For the preparation of the offset printing plate, the exposed areas of the layer are removed by means of the following developer solution:
1.3 per cent of sodium metasilicate . 9 $H_2O$,
0.8 per cent of trisodium phosphate . 12 $H_2O$,
0.1 per cent of monosodium phosphate (anhydrous),
0.1 per cent of Thymol Blue, and
97.7 per cent of distilled water.

After 10,000 prints, even the 60 line screens were satisfactorily reproduced; the printing run was then stopped.

The trichloromethyl pyrone used in the above formulation may be replaced by the same quantity of 4-(4-methoxy-phenyl)-6-trichloromethyl-2-pyrone (melting point 143° C) or of 4-(4-methoxy-strene)-6-trichloromethyl-2-pyrone (melting point 166° C).

The differences in the preparation of these printing plates are very slight, because these three halogen compounds resemble each other in their effectiveness in splitting the orth-ester. Their effects may be compared by making copies through a continuous-tone step wedge. More significant differences in application techniques may be caused by variations in the novolak content. If the layer has only a small content of novolak, i.e., up to the amount of the ortho-ester, development is delayed. The same occurs when the proportion of novolak is too high. A ratio between novolak and ortho-ester of about 2 : 1 has been found to be most suitable.

EXAMPLE 3

The following substances were combined to form a coating solution:
4.5 p. b. w. of the novolak used in Example 2,
1.4 p. b. w. of Compound No. 3 (Table 1),
0.3 p. b. w. of 4-(4-phenyl-butadiene-1-yl)-6-trichloromethyl-2-pyrone (melting point 184° C)
0.01 p. b. w. of Crystal Violet, and
93.8 p. b. w. of methylisobutyl ketone.

This solution is coated onto a mechanically roughened aluminum foil which has been pre-treated with polyvinyl phosphonic acid by the method described in German Pat. No. 1,134,093. After exposure under a positive master, a clearly visible image of godd contrast is obtained. For the preparation of the printing form the exposed plate is developed in known manner with the developer solution of the composition given below, the exposed areas of the layer being removed and the deep-blue unexposed areas of the layer being retained as an offset printing stencil.
0.6 per cent of sodium hydroxide,
0.5 per cent of sodium metasilicate . 5 $H_2O$
1.0 per cent of n-butanol,
97.9 per cent of distilled water.

Alternatively, the above-mentioned trichloromethyl pyrone may be replaced by the same quantity of 4-(4-methoxy-α-methyl-strene)-6-trichloromethyl-2-pyrone or 4-(4-nitro-styrene)-6-trichloromethyl-2-pyrone (melting point 207° C).

The light-sensitivity of the offset printing plates presensitized according to this Example corresponds to that of the materials according to Example 2, except that the plate containing the last-mentioned trichloromethyl pyrone is somewhat less sensitive. The quality of the prints was still good after a run of 10,000 copies.

EXAMPLE 4

A copying layer of the following composition:
25 per cent of Compound No. 5 (Table 1),
4 per cent of 2,4-bis-(trichloromethyl)-6-p-methoxystyrene-s-triazine,
70 per cent of the novolak used in Example 1, and
1 per cent of Crystal Violet is applied in a thickness corresponding to approximately 2 g per square meter to an aluminum base which had been roughened by brushing with wire brushes and the resulting material is used for offset printing plates. After exposure under conventional light sources, the exposed layer is removed in 1 minute by means of the developer used in Example 3, and the plate is then rinsed with water and inked with greasy ink or coated with a preserver.

The shelf life of the offset printing plate presensitized in this manner was investigated for practical tests. Under severe storage conditions, in a heating chamber at 42° C, only slight differences from the initial values were discovered after 100 days of storage. The time required for development was increased to 1.5 minutes, but at the same time the resistance to the developer, i.e. the reaction time until corrosion of the image begins, is extended to 10 minutes. This means that the storability of such positive plates at normal temperatures is at least one year.

EXAMPLE 5

The following combinations were tested as offset copying layers:
4.0 p. b. w. of the novolak used in Example 2,
1.2 p. b. w. of Compound No. 22 (Table 3),
0.01 p. b. w. of Crystal Violet and
0.2 p. b. w. of naphthoquinone-(1,2)-diazide-(2)-5-sulfochloride, dissolved in
94.59 p. b. w. of methyl ether ketone were coated onto mechanically roughened aluminum. After six minutes' exposure under a positive master, using the tube exposure apparatus "Printaphot", and one minute's immersion in and wiping with the developer used in Example 1, a blue copy of the master is obtained on a clean, scum-free aluminum surface. Similar results are produced when one of the following diazonium salts is used in an equal quantity as the component which splits-off the acid:

4-(di-n-propyl-amino)-benzene-diazonium tetrafluoroborate,
4-morpholino-2,5-diethoxy-benzene diazonium tetrafluoroborate,
2-dimethylamino-4,5-dimethyl-benzene diazonium-tetrachloro zincate,
diphenylamine-4-diazonium-sulfate, and
4-heptamethylene-imino-benzene diazonium-hexafluoro-phosphate.

If a clean development proves difficult — which depends, inter alia, on the degree of drying of the layer — the processing method may be adapted to the particular layer by varying the concentration of the developer or by adding a solvent, or by using 50 per cent ethanol as the developing agent.

EXAMPLE 6

A re-enlargement plate is prepared by dissolving
4.0 p. b. w. of the novolak used in Example 1,
1.2 p. b. w. of Compound No. 37,
0.2 p. b. w. of 4-(4-phenyl-butadien-1-yl)-6-trichloromethyl-2-pyrone, and
0.01 p. b. w. of Crystal Violet in
94.6 p. b. w. of methyl ethyl ketone and whirler-coating a brushed aluminum plate with the resulting solution:

The plate is exposed for 3 minutes uder a positive transparency, using a projector of the type "Leitz Prado" (1 : 2.5, $f$ = 85 mm) containing a 150-watt lamp at a distance of 160 cm. By immersion in the developer used in Example 1, an enlarged copy of the black and white line copy on the transparency is produced within 30 seconds, which may be reproduced by printing in a small offset press.

Similar results are produced when using the same quantity of Compound No. 70 as the ortho-ester.

EXAMPLE 7

For the preparation of a positive dry resist layer,
30 p. b. w. of the novolak used in Example 1,
8 p. b. w. of Compound No. 6 (Table 1), and
2 p. b. w. of naphthoquinone-(1,2)-diazide-(2)-4-sulfochloride
are dissolved in a mixture of
46 p. b. w. of methyl ethyl ketone and
14 p. b. w. of dioxane.

If desired, the solution may be colored by adding a soluble dye or a finely divided dyestuff pigment.

An approximately 25 μm thick polyester film which had been pretreated according to Example 1 of German Offenlegungsschrift No. 2,236,941, is coated with this solution to produce an about 40 – 50 μm thick layer and is then dried. In order to protect it against dust and scratches, the layer may be laminated with a polyethylene top coating.

For the preparation of a circuit board, the positive dry resist thus obtained may be freed from the top coating and then laminated in a commercially available laminator to a cleaned, previously heated base composed of insulating material carrying a 35 μm thick copper layer on one or both surfaces. After removal of the polyester film, possilbly subsequent drying, exposure under a master to a 5 kW metal halide lamp (distance 140 cm, exposure time approx. 100 sec.) and a spray development of about 5 to 7 minutes with the developer used in Example 1 which may contain small amounts of a solvent, such as n-butanol, an excellent resist in the form of an image is produced. It is not only resistant under the conditions of etching processes, for example with $FeCl_3$, but also to electroplating baths used in the preparation of through-hole printed circuits, especially the consecutive electrodeposition of copper and nickel layers.

Despite the thickness of the layer, relatively short exposure times are possible, which cannot be achieved with positive layers of the same thickness based on naphthoquinone diazides.

EXAMPLE 8

For an imaging process using electron beams, anodized aluminum is whirler-coated with the following solution:
4.0 p.b.w. of the novolak used in Example 2,
1.2 p.b.w. of Compound No. 44,
0.2 p.b.w. of 4-[2-furyl-(2)-vinyl]-6-trichloromethyl-2-pyrone (melting point 171° C) and
0.01 p.b.w. of Crystal Violet in
94.6 p.b.w. of methyl ethyl ketone.

By means of an electron beam and applying a pressure of $10^{-5}$ mm Hg, a trace is produced on the material which is distinctly visible to the naked eye. By varying the conditions of irradiation, the following energy ranges were determined in which the layer is positive-working, i.e., is dissolved away in the exposed areas by a 10 seconds' to 3 minutes' treatment with the developer used in Example 1. A positive image is produced with the present layer by irradiation with an energy of about 1 to 100 . $10^{-2}$ Joule/$cm^2$ while applying a voltage of 11 kV.

In the case of a commercially available positive-working planographic printing plate based on naphthoquinone diazide, which was also irradiated for comparison purposes, an energy of 275 to 550 . $10^{-2}$ Joule/$cm^2$ was required.

EXAMPLE 9

The following solution is used for the preparation of a positive-working color proofing film:
2.0 p.b.w. pf the novolak used in Example 1,
0.6 p.b.w. of Compound No. 20 (Table 2),
0.1 p.b.w. of diphenylamine-4-diazonium-sulfate, and
0.005 p.b.w. of Crystal Violet dissolved in
97.3 p.b.w. of methyl ethyl ketone.

A web of polyester film of 100 μm thickness is coated with the resulting solution and then dried and wound up. After exposure under a positive master (100 seconds, using a 5 kW metal halide lamp), development by wetting and wiping with the developer used in Example 3, rinsing with water, and drying, the positive material presensitized in this manner yields a blue copy of the master. It may be used as a registration guide for the layout.

Similar results are obtained when using the Compound No. 34B as the cleavable ortho-ester and exposing for 200 seconds. The following ortho-esters are also suitable:
Compound No. 13 (Table 2)
Compound No. 15 (Table 2)
Compound No. 16 (Table 2)
Compound No. 17 (Table 2)
Compound No. 18 (Table 2)
Compound No. 33

Compounds Nos. 14 and 19 (Table 2) are less suitable because of their low solubility.

EXAMPLE 10

A solution composed of
4.0 p.b.w. of the novolak used in Example 2,
1.2 p.b.w. of the Compound No. 23 (Table 3),
0.2 p.b.w. of 4-(2,4-dimethoxy-styrene)-6-trichloromethyl-2-pyrone (melting point 180° C), and
0.01 p.b.w. of Crystal Violet, in
94.6 p.b.w. of methyl ethyl ketone,
is whilrer-coated onto anodized aluminum so that a layer of a thickness of 2 to 2.5 μm is produced and dried. After three minutes' exposure under a positive master, using a 3 kW xenon impulse lamp at a distance of 120 cm, the exposed areas of the layer were removed during 15 – 30 seconds without scumming by using the following developer:
7 per cent of trisodium phosphate . 12 $H_2O$
3 per cent of sodium metasilicate . 9 $H_2O$
90 per cent of distilled water.

When the printing plate is inked up with greasy printing ink in the usual manner, the image areas accept the black ink.

Only slight changes in the developing conditions are necessary when half the amount of Compound No. 23 is replaced by Compound No. 24.

EXAMPLE 11

In the following coating solution, the influence of the halogen compound is tested:
4.0 p.b.w. of the novolak used in Example 1,
1.2 p.b.w. of Compound No. 29 (Table 4),
0.1 p.b.w. of the triazine used in Example 4 as the initiator, and
0.01 p.b.w. of Crystal Violet, in
94.7 p.b.w. of methyl ethyl ketone.

The solution is coated as an about 2 μm thick layer onto mechanically roughened aluminum foil. After 20 seconds' exposure under a 5 kW metal halide lamp through a positive master, a clearly visible image of good contrast is obtained. For the preparation of the printing form the exposed plate is developed in known manner with a 5 per cent sodium metasilicate solution in distilled water, the exposed areas of the layer being removed and the deep-blue colored unexposed areas being retained as the printing stencil.

The ortho-ester used above may be replaced by the same quantity of Compound No. 28 (Table 4).

The printing plate containing the mono-ortho-ester is distinctly more light-sensitive than the one containing the bis-ortho-ester as the compound splitting-off the acid.

If the proportion of the halogen compound splitting-off the acid is increased to ten times the above quantity, longer developing times become necessary.

EXAMPLE 12

A coating solution composed of
4.0 p.b.w. of the novolak used in Example 2,
1.2 p.b.w. of the Compound No. 27 (Table 3),
0.2 p.b.w. of 4-(3,4-methylenedioxy-styrene)-6-trichloromethyl-2-pyrone (melting point 182° C), and
0.01 p.b.w. of Crystal Violet in
94.6 p.b.w. of methyl ethyl ketone
is applied, by whirler-coating, to a base composed of an aluminum foil with a thin layer of chromium. After 20 seconds' exposure, the foil is immersed in 5 per cent sodium metasilicate solution and the exposed areas of the layer are cleanly removed from the chromium surface within 1 minute. The plate then may be used for printing in an offset machine.

EXAMPLE 13

The following solution is used for the preparation of a photo resist:
8.0 p.b.w. of the novolak used in Example 2,
1.5 p.b.w. of Compound No. 4 (Table 1),
1.0 p.b.w. of Compound No. 25 (Table 3),
0.5 p.b.w. of the trichloromethyl pyrone used in Example 12, and
0.01 p.b.w. of Crystal Violet, dissolved in
60.0 p.b.w. of methyl ethyl ketone and
29.0 p.b.w. of acetonitrile.

Composite plates composed of a 35 μm thick copper foil and an insulating material are coated with this solution in order to prepare printed circuit boards. After drying the approximately 3 μm thick layer and exposing it for 4 minutes in a tubular exposure apparatus type "Printaphot" under a positive master showing a circuit, the copper is bared in the exposed areas by immersion in or spraying with the developer indicated in Example 10.

The plates are then etched with a conventional copper etching solution, for example a ferric chloride solution, the areas of the copper foil covered with the unexposed resist layer being retained. Even if the etching process is prolonged to three times the time required for removal of the bared copper layer, the resist edges of the stencil — which by then are undercut — are smooth and not ragged. The still light-sensitive layer may be removed after etching by an after-exposure without original followed by a second treatment with the developer solution, or by decoating with strongly alkaline solutions, e.g. a 5 per cent NaOH solution, or polar solvents, e.g. acetone. After providing the printed circuit board with electronic structural elements, the conducting paths may be protected in the normal manner by tin-plating and soldered.

Even after three weeks' storage at room temperature the photoresist layer described above yielded usuable results; spray development took 2 minutes instead of 1.5, however.

Similar results were produced when the Compound No. 4 was replaced by Compound No. 12 in the same amount.

EXAMPLE 14

Electrolytically roughened and anodized aluminum is coated with the following coating solution:
4.0 p.b.w. of the novolak used in Example 2,
1.2 p.b.w. of Compound No. 26 (Table 3),
0.2 p.b.w. of tris-tribromo-methyl-s-triazine, and
0.01 p.b.w. of Crystal Violet, in
94.6 p.b.w. of methyl ethyl ketone.

Another solution is prepared in which the triazine is replaced by the same quantity of 4-methyl-6-trichloromethyl-2-pyrone.

Further, parts of the two solutions were each mixed with 0.08 per cent of the sensitizer N-phenyl acridone, and the resulting solutions were also used for coating on plates.

Whereas the layers containing no sensitizer yielded satisfactory results during normal irradiation periods under the unfiltered light of a high-pressure mercury lamp only, an exposure of 200 seconds with a 5 kW metal halide lamp and immersion in and wiping with the developer used in Example 1 sufficed in the case of the sensitized layers to produce an offset printing plate which showed defects in the light points of the 60-line screen only after 20,000 copies.

EXAMPLE 15

6.0 p.b.w. of the novolak used in Example 1,
1.8 p.b.w. of Compound No. 32 (Table 2),
0.3 p.b.w. of the triazine used in Example 4, and
0.02 p.b.w. of Crystal Violet, are dissolved in
91.9 p.b.w. of methyl ethyl ketone
and coated onto a wire-brushed aluminum foil. After an exposure of only 5 seconds (approx.) under a 5 kW metal-halide lamp and immersion in the developer used in Example 3, a positive copy of the original used is obtained. The copy may be used for printing.

EXAMPLE 16

4.0 p.b.w. of the novolak used in Example 1,
2.0 p.b.w. of a novolak type "Alnovol PN 320",
1.6 p.b.w. of Compound No. 9 (Table 1),
0.4 p.b.w. of 4-(4-methoxy-α-styrene)-6-trichloromethyl-2-pyrone, and
0.01 p.b.w. of Crystal Violet, are dissolved in
60.0 p.b.w. of methyl ethyl ketone and
32.0 p.b.w. of acetonitrile,
and the resulting solution is whirler-coated onto a mechanically roughened aluminum plate and dried. For the preparation of an offset printing plate, the plate is then imagewise exposed for 150 seconds under a 5 kW metal halide lamp, spray-developed for about 0.5 to 1 minute with the developer used in Example 3, rinsed and finally inked up.

EXAMPLE 17

A coating solution is prepared from
8.0 p.b.w. of the novolak used in Example 1,
2.4 p.b.w. of Compound No. 1,
0.4 p.b.w. of 4-(4-methoxy-styryl)-6-trichloromethyl-2-pyrone, and
0.02 p.b.w. of Crystal Violet in
89.2 p.b.w. of methyl ethyl ketone.
The solution may be diluted with up to 40 p.b.w. of trichloroethylene.

A nickel cylinder provided with the customary electrically conductive separating layer is coated with the resulting solution in a manner such that the resulting layer has a thickness of at least 20μm. The curved surface is then exposed under a line original or a positive halftone original and developed by means of the developer used in Example 3. The printing form is produced by electroplating, i.e., during the nickel facing process which follows a growing nickel layer is formed on the thin separating layer around the unexposed, dot- or line-shaped remains of the layer still present. When the nickel layer has reached a thickness which is most favorable with regard to the thickness of the resist and to its mechanical properties, the curved stencil thus formed is axially withdrawn from the cylinder with the aid of the separating layer and is freed from traces of the copying layer and of the separating layer, using acetone, for example. The open holes or lines in the cylindrical nickel skin, which form the image and whose sizes vary in accordance with tone values, allow the penetration of the printing ink during rotary screen printing.

The coating composition used in this Example shows a good adherence to the separating layer, dries rapidly, and produces a clean copy, i.e., despite the face that the relation between their height and width is unfavorable, especially in the case of small dots, the individual layer dots forming the image areas adhere firmly to the separating layer, whereas the exposed areas may be developed without scumming.

EXAMPLE 18

A satisfactory printing plate is prepared as follows:
4.0 p.b.w. of the novolak used in Example 2,
1.2 p.b.w. of the Compound No. 30 (Table 4),
0.2 p.b.w. of 2-methoxy-4,6-bis-tribromomethyl-s-triazine,
0.08 p.b.w. of N-phenyl-acridone, and
0.01 p.b.w. of Crystal Violet
are dissolved in
94.5 p.b.w. of methyl ethyl ketone
and a mechanically roughened aluminum foil is coated with the resulting solution. A similar coating solution containing the same quantity of Michler's ketone instead of N-phenyl-acridone and a comparison solution containing neither of these sensitizers are prepared analogously.

When the first of these plates is exposed for 200 seconds to a 5 kW metal halide lamp, development with the developer used in Example 10 produces a clean printing plate within 20 seconds.

In order to produce similar results with the second plate, an exposure time of 300 seconds is required, and in the case of the third plate (which contains no sensitizer) the exposure time is still longer.

EXAMPLE 19

A polyester film having a thickness of 180μm is coated with the following solution:
5.0 p.b.w. of the novolak used in Example 2,
1.0 p.b.w. of polyvinyl pyrrolidone ("Luviskol" K 90, BASF),
1.8 p.b.w. of Compound No. 31 (Table 4),
0.3 p.b.w. of 4-(4-cyano-styryl)-6-trichloromethyl-2-pyrone (melting point approx. 250° C) and
2.0 p.b.w. of Sudan Deep Black BB (C.I. 26,250), in
89.9 p.b.w. of methyl ethyl ketone.

The greyish-black film thus produced may be used for facilitating and controlling mounting operations in offset printing. For this purpose, a sample of appropriate size is exposed under the original for 20 seconds to a metal halide lamp and then developed with the developer used in Example 1. In this manner, a direct copy of the original is obtained. After use, the imaged film may be decoated, either by treatment with acetone or by exposing it without an original and removing the layer with the developer used in Example 10, and then may be used again as a mounting aid.

EXAMPLE 20

A coating solution is prepared by dissolving
6.0 p.b.w. of the novolak used in Example 2,
2.0 p.b.w. of Compound No. 43,
0.2 p.b.w. of the triazine used in Example 4, and
0.01 p.b.w. of Crystal Violet in
91.8 p.b.w. of methyl ethyl ketone.

The resulting solution may be used for coating multi metal plates composed of layers of brass and chromium, or of aluminum, copper and chromium, or of iron, copper and chromium, as the case may be. Before coating, the hydrophilic chromium surface produced on these plates according to specific processes must be freed from its protective coating by rinsing with water.

After application of the coating solution by a known method and drying of the layer in a continuous-heating furnace, a glossy negative-working presensitized offset printing plate of high quality and good shelf like is obtained. If the layer on the plate has a thickness of approximately 3 μm, the plate is exposed for 5 seconds under a 5 kW metal halide lamp from a distance of 140 cm. Within 2 minutes the exposed areas of the layer are then removed by immersion in or spraying or wiping with the developer used in Example 1 to which, if desired, an alkaline wetting agent may be added, for example phenyl sulfonate. The chromium layer bared in this manner is then etched away to the brass or copper layer underneath, using a commercially available chromium etch. Then, the unexposed layer is removed by means of an appropriate (alkaline) decoating solution or a polar solvent, resulting in a plate which is composed of hydrophilic chromium areas and oleophilic brass or copper image areas and which then may be treated with a preservative or inked up for printing.

EXAMPLE 21

10.0 p.b.w. of the novolak used in Example 1,
3.0 p.b.w. of diphenoxymethyl-naphthyl-(2)-ether,
0.5 p.b.w. of naphthoquinone-(1,2)-diazide-(2)-4-sulfochloride, and
0.01 p.b.w. of Crystal Violet,
are dissolved in
86.5 p.b.w. of methyl ethyl ketone.

Both surfaces of an approximately 0.5 mm thick sheet of a specical copper alloy are coated with this solution by immersion. After the immersion-coating process (up to a layer thickness of 10 g per m²), the coated sheet is exposed from both sides to congruent mirror images of the desired shaped part, developed by spraying with the developer used in Example 11, and finally etched by spraying from both sides with an $FeCl_3$ solution, for example. This chemical milling technique is particularly advantageous if the image of the metal part, for example of a spring shackle, is copied in commercial quantities, i.e., larger numbers of the image side by side, in one operation. The copying composition according to the present invention is particularly suitable for this process because it adheres very well to numerous different metal surfaces.

The o-formic acid ester used above may be replaced by the same quantity of Compound No. 69.

EXAMPLE 22

9.0 p.b.w. of the novolak used in Example 1,
1.0 p.b.w. of vinyl acetate-crotonic acid-copolymer (95 : 5),
3.0 p.b.w. of Compound No. 2 (Table 1),
0.5 p.b.w. of the triazine used in Example 4, and
0.3 p.b.w. of Zapon Fast Violet BE (C.I. 12,196)
are dissolved in
86.2 p.b.w. of ethyleneglycol monoethyl ether.

A cleaned zinc plate is coated with this solution and dried. The resulting positive-working light-sensitive etching plate is then exposed for 5 minutes under a positive original, using a 3 kW pulsed xenon lamp at a distance of 120 cm. After removal of the exposed areas of the layer by immersion in and wiping with the developer used in Example 3, an image is obtained which is converted into a relief etching or relief printing plage by etching with a 3 – 5 per cent nitric acid solution to which an additive for powderless etching may be added. if desired. In order to improve the adhesion or anchoring of the layer during the powderless etching process and during manual after-treatment for tone correction, the plage may be heated for 5 to 15 minutes to temperatures between 100° and 200° C after development but prior to etching.

Similar results are obtained by replacing Compound No. 2 by Compound No. 10 (Table 1) or Compound No. 68.

EXAMPLE 23

A coating solution composed of
4.0 p.b.w. of the novolak used in Example 1,
1.2 p.b.w. of Compound No. 8 (Table 1),
0.2 p.b.w. of 2,5-diethoxy-4-(p-tolyl-mercapto)benzene diazonium-hexafluorophosphate, and
0.1 p.b.w. of Crystal Violet, dissolved in
94.6 p.b.w. of methyl ethyl ketone
is whirler-coated onto mechanically roughened aluminum and dried. By 60 seconds' exposure under a positive original, using a 5 kW metal halide lamp, an image is produced, and a clean copy of the original is obtained by immersing the image for 1 minute in the developer used in Example 1.

EXAMPLE 24

A paper foil which is provided with a coating of a hydrophilic colloidal binder with a finely divided inorganic pigment according to U.S. Pat. No. 2,534,588, and is suitable for use as a printing plate is coated with the following solution:
4.0 p.b.w. of the novolak used in Example 1,
1.2 p.b.w. of Compound No. 37,
0.2 p.b.w. of the pyrone used in Example 8, and
0.01 p.b.w. of Crystal Violet, dissolved in
94.6 p.b.w. of methyl ethyl ketone
in order to prepare it for imaging by laser beams. The foil is then imagewise illuminated over all spectral lines, using an argon-ion laser with a maximum beam current intensity of 32 Amp. and a light output of 3 Watts. By focusing with an optics, the illuminated spot was adjusted to a diameter of about 10 μm. The intensity of the beam current was varied between 17 and 32 Amps and the writing rate of the laser beam varied between 60 and 30 mm/sec. After illumination within this energy range, the track already became visible. It was distinctly developed by 10 to 20 seconds' development with the developer used in Example 1 and made conspicuous by inking the unilluminated areas with greasy ink, as is cus- If the conditions mentioned in the following table are maintained the layers irradiated with electron beams are positive-working Table 5

| Ortho-ester Compound No. | Initiator | Voltage | Irradiated energy (Joule/cm$^2$) | Developer used in Ex. | Developing time (seconds) |
| --- | --- | --- | --- | --- | --- |
| 21 | diazonium salt used in Example 23 | 11 kV | 1–30 ·10$^{-2}$ | 3 | 30 |
|  | triazine used in Ex. 4 | 11 kV | 10–60 ·10$^{-2}$ | 3 | 45 |
|  | C$_2$Br$_5$H | 11 kV | 10–300·10$^{-2}$ | 3 | 30 |
|  | tribromo-methyl-phenyl-sulfone | 11 kV | 100–500·10$^{-2}$ | 3 | 15 |
| 26 | diazonium salt used in Ex. 23 | 11 kV | 10–150·10$^{-2}$ | 3 | 30 |
|  | 2,5-diethoxy-4-benzoyl-amino-benzene-diazonium tetrachloro zincate | 11 kV | 20–60 ·10$^{-2}$ | 3 | 30 |
| 4 | diazonium salt used in Ex. 23 | 11 kV | 10–100·10$^{-2}$ | 1 | 45 |
|  | C$_2$Br$_5$H | 11 kV | 40–600·10$^{-2}$ | 1 | 60 |
| 44 | tris-tribromomethyl-triazine | 11 kV | 10–60 ·10$^{-2}$ | 1 | 10 |
|  | triazine used in Example 4 | 11 kV | 1–30·10$^{-2}$ | 1 | 30 |
|  | 2-tribromo methyl-quinoline | 11 kV | 10–60·10$^{-2}$ | 1 | 10 |
|  | C$_2$Br$_5$H | 11 kV | 1–100·10$^{-2}$ | 1 | 20 |
|  | 2,2',4,4',6,6'-hexabromo-diphenylamine | 11 kV | 20–100·10$^{-2}$ | 1 | 60 | tomary for offset printing plates.

EXAMPLE 25

A copying layer of the following composition is used for the production of a gravure cylinder suitable for printing paper and film by halftone gravure:

73.0 p.b.w. of the novolak used in Example 1,
12.0 p.b.w. of Compound No. 41,
10.0 p.b.w. of Compound No. 50,
3.5 p.b.w. of the triazine used in Example 4, and
1.5 p.b.w. of Crystal Violet.

A solution of these substances — which may vary within wide limits as to the solvent and the solids content selected, depending on the desired layer thickness and the drying and processing conditions — is uniformly applied, by means of a spray gun, to a freshly polished rotating copper cylinder and dried. The cylinder is then exposed by panoramic exposure under a negative halftone original, using a light source which is customary in gravure printing plants. For development, a 5 per cent sodium metasilicate solution is poured onto the slowly rotating cylinder and is then rinsed off with water. After drying, the image-free areas of the cylinder may be covered with asphalt varnish, if desired. The wells required for gravure printing are then etched in the normal manner with a ferric chloride solution, the copying layer and the varnish cover are removed, and the gravure cylinder, which is now ready for printing, is finally chrome-plated, if desired.

Similar results are obtained when Compound No. 43 or the Compound No. 50 is used instead of Compound No. 42 as the o-ester.

EXAMPLE 26

Layers of the composition given below may be used for imaging by means of laser beams. The layers are applied to mechanically roughened aluminum in a thickness of approximately 2 μm, dried, illuminated, developed, and finally inked with greasy ink.

74.0% or the novolak used in Example 1,
22.0% of the ortho-ester,
3.8% of initiator, and
0.2% of a dyestuff.

The use of acid donors which absorb in the shorter wave range, i.e., outside of the range of visible light and outside of the optimum emission range of conventional light-sources, but are very suitable for irradiation with electron beams, such as pentabromo ethane and tris-tribromo methyl trizine, has the particular advantage that the layers containing such initiators may be handled in normal light. If layers containing these two initiators are exposed for 3 minutes to the light of a 5 kW metal halide lamp and developed with the developer used in Example 3, even after 5 minutes no image is obtained.

EXAMPLE 27

4.0 p.b.w. of the novolak used in Example 1,
1.2 p.b.w. of Compound No. 53,
0.2 p.b.w of the triazine used in Example 4, and
0.4 p.b.w. of Rhodamine G extra,
are dissolved in
94.2 p.b.w. of methyl ethyl ketone.

When a corresponding blue-colored film is to be produced, the red dyestuff used above may be replaced by Victoria Pure Blue FGA (C.I. Basic Blue 81).

180 μm thick polyester films are coated with these solutions and then dried in a manner such that the resulting layers have a thickness of maximally 1 μm. By exposing the layers under a metal halide lamp to positive originals, which may be the corresponding color separations of a multi-color print, and developing them with an aqueous-alkaline developer, for example the developer used in Example 1, colored copies of the original used are obtained. The clarity and adhesion of these layers to the untreated surfaces of polyester films, which are due to the good compatibility of the o-esters with the other components of the layer, are particularly favorable and striking.

Equally good results are obtained when Compound No. 53 is replaced by the amide acetal Compound No. 52.

EXAMPLE 28

A mixture of o-esters is used for making colored films for use in offset copying.

4.0 p.b.w. of the novolak used in Example 2,
0.8 p.b.w. of the Compound No. 4 (Table 1), 0.4 p.b.w. of the Compound No. 7 (Table 1),
0.2 p.b.w. of the pyrone used in Example 12, and
2.0 p.b.w. of Grasol Fast Yellow
are dissolved in
92.6 p.b.w. of methyl ethyl ketone.

If corresponding red color-proofing films are to be produced, the yelloy dyestuff used above may be replaced by Grasol Fast Rubin 2 BL (C.I. Solvent Red 128).

100 μm thick polyester films are coated with these solutions in a manner such that the resulting layers have a maximum thickness of 1 μm and then dried. After exposure under positive originals, which may be the corresponding color separations of a multi-color print, and development with 3 per cent sodium hydroxide solution, colored copies of the originals used are obtained.

Compound No. 7 may be replaced by Compound No. 11 or Compound No. 24.

EXAMPLE 29

4.0 p.b.w. of the novelak used in Example 2,
1.2 p.b.w. of Compound No. 51,
0.2 p.b.w. of the diazonium salt condensation product according to Example 4 of German Offenlegungsschrift No. 2,041,395, and
0.01 p.b.w. of Crystal Violet are dissolved in
94.6 p.b.w. of an 8:2 mixture of methyl ethyl ketone and methanol,
and the resulting solution is then applied to wire-brushed aluminum and dried. After 100 seconds' exposure to a metal halide lamp, an image becomes visible which has a very good contrast and which may be developed during about 20 seconds by immersion in the developer used in Example 1.

A similar copy on an aluminium base, which may be used for printing, is obtained by using 2,5-diethoxy-4-benzoylamino-benzene diazonium chloride, in the form of the zinc chloride double salt, as the acid donor. So that the diazo compound dissolves more readily, alcohols, such as ethylene glycol monomethyl ether or methanol, may be added to the solvent.

EXAMPLE 30

A coating solution composed of
6.0 p.b.w. of a styrene/maleic anhydride copolymer with an acid number of 300 and a molecular weight of approx. 1500,
1.6 p.b.w. of the Compound No. 41,
0.3 p.b.w. of the pyrone used in Example 8, and
0.01 p.b.w of Crystal Violet, dissolved in
92.1 p.b.w. of methyl ethyl ketone,
is whirler-coated onto wet-brushed aluminum and then dried. After 70 seconds' exposure under a 5 kW metal halide lamp, the exposed areas of the layer are removed by immersion in and wiping with 5 per cent triethanol amine solution. The resulting positive copy of the original may be developed by rinsing it briefly with isopropanol.

Similar results are produced when the same quantity of a compound is used as the initiator which is obtained by chlorination of 4-(4-methoxy-styryl)-6-trichloromethyl-2-pyrone as follows:

1 ml of dimethyl formamide is added to a suspension of 57.5 g of 4-(4-methoxy-phenyl)-2-methyl-butadiene-2-carboxylic acid in 200 ml of benzene and 75 g of carbonyl chloride are introduced at 50° C over a period of 2 hours. The solvent is then distilled off under reduced pressure and the residue is dissolved, together with 95 g of trichloro acetyl chloride, in 400 ml of methylene chloride. A misture of 58 g of triethyl amine and 70 ml of methylene chloride is added to the solution at 5° to 10° C while agitating, and the mixture is further stirred for 24 hours at this temperature and then for another 24 hours at room temperature, then washed twice in water and twice in an aqueous solution of NaHCO$_3$, dried with sodium sulfate, and freed from the solvent by distillation under reduced pressure. The residue weighs 92 g and has a melting point of 160° C. By recrystallization from aceto nitrile, the melting point is raised to 166° C.

6.9 g of the pyrone are dissolved in 30 ml of chloroform and the solution is heated for 30 minutes with 2.9 g of sulfuryl chloride with reflux. Then, the solution is washed four times with water, dried with sodium sulfate, and evaporated under reduced pressure. The residue is triturated with methanol, drawn off, and dried. Yield: 3.5 g, melting point 160° C.

EXAMPLE 31

In order to conduct a light-sensitivity test between o-ester layers and acetal layers,
4.0 p.b.w. of the novolak used in Example 1,
0.2 p.b.w. of the triazine used in Example 4,
0.01 p.b.w. of Crystal Violet, and
1.2 p.b.w. of bis-tetra-hydropyrane-2-yl-ether of 4,4'-isopropylidene-diphenol, are dissolved in
94.6 p.b.w. of methyl ethyl ketone.

Two further coating solutions are prepared by replacing the acetal compound by the same quantities of Compound No. 40 and Compound No. 3, respectively. The solutions are applied to mechanically roughened aluminum, dried, exposed, and developed with the developer used in Example 1.

In order to be able to develop these three layers within about 1.5 minutes, the following minimum exposure times under a 5 kW metal halide lamp are required:
Acetal: about 100 seconds,
Compound No. 40: 1–3 seconds,
Compound No. 3: 10–20 seconds.

The homologues containing from 1 to about 30 ethylene oxide units resemble Compound No. 40 in their light-sensitivity. With an increasing length of their chains, the compounds obtained from polyglycol 600 (with an average of 13 units) to polyglycol 1000 (with an average of approx. 23 ethylene oxide units) cause a retardation of development, which, however, may be compensated by using Alnovol PN 430 instead of Alnovol PN 429.

EXAMPLE 32

6.0 p.b.w. of the novolak used in Example 2,
1.8 p.b.w. of Compound No. 21 (Table 3),
0.3 p.b.w. of 2,4-bis-(trichloromethyl)-6-p-dimethylaminostyryl-s-triazine, and
0.02 p.b.w. of Crystal Violet
are dissolved in
91.9 p.b.w. of methyl ethyl ketone,
and the resulting solution is applied to wire-brushed aluminum and dried. A 3 watt argon-ion laser with a beam current intensity of 32 A is used for writing on the plate with a speed of 10 to 30 mm per second. The layer on the track produced by the laser is removed by 30 seconds' immersion in or rinsing with the developer used in Example 1. The unexposed areas of the layer may be inked with greasy ink and used for printing in an offset printing machine.

EXAMPLE 33

Brushed aluminum plates are coated by immersing them in solutions of
  10.64 p.b.w. of the novolak used in Example 1,
  3.20 p.b.w. of an o-ester, and
  0.16 p.b.w of 2,4-bis-trichloromethyl-6-p-methoxy-styryl-s-triazine in
  86.0 p.b.w. of methyl ethyl ketone.

After removal from the solution and evaporation of the solvent, the plates are dried for 20 seconds in a current of warm air and exposed through a line original covered by a 1 mm thick glass plate. The exposure device contains 4 luminescent tubes (type TLAK 40 W/05, manufacturer Philips) arranged at a distance of 4 cm from each other. The distance between the peripheries of the tubes and the surface of the plates is about 5 cm.

The exposure times required for the individual orthesters are as follows:

| Compound | Exposure Time (seconds) |
|---|---|
| 65 | 20 |
| 55 | 30 |
| 54 | 30 |
| 36 | 0.5 |
| 35 | 0.5 |
| 38 | 0.5 |
| 59 | 1.5 |
| 61 | 1.5 |
| 63 | 1.5 |
| 62 | 1.5 |
| 64 | 1.5 |
| 66 | 1.5 |
| 67 | 2.5 |
| 60 | 3.0 |

After development with the developer of Example 1, a positive image of the original is obtained in each case.

EXAMPLE 34

The following coating solutions, in which acetals are contained as the compounds splitting-off the acid, were used for the preparation of layers for electron-beam sensitive offset printing plates. For this purpose
  4.0 p.b.w. of the novolak used in Example 1,
  1.2 p.b.w. of the acetal used in Example 31,
  0.2 p.b.w of the initiator, and
  0.02 p.b.w. of Crystal Violet
are dissolved in
  94.6 p.b.w. of methyl ethyl ketone
and the solution is coated onto mechanically roughened aluminum (Stock Solution A). Stock Solution B is obtained by replacing the above acetal by the bis-tetrahydro pyranyl ether of 4,4'-dihydroxy-diphenyl sulfone.

TABLE 6

| | | kV | Joule/cm$^2$ | Seconds |
|---|---|---|---|---|
| A. | Diazonium salt used in Example 23 | 11 | $2-100 \cdot 10^{-2}$ | 45 |
| | C$_2$Br$_3$H | 11 | $1-100 \cdot 10^{-2}$ | 35 |
| | Triazine used in Example 4 | 11 | $1-30 \cdot 10^{-2}$ | 50 |
| B. | Tris-tribromo-methyl-triazine | 11 | $10-300 \cdot 10^{-2}$ | 30 |
| | Triazine used in Example 4 | 11 | $10-100 \cdot 10^{-2}$ | 30 |
| | 4-(2,4,6-trimethoxy-styryl)-6-trichloro-methyl-2-pyrone (melting point 170° C) | 11 | $10-150 \cdot 10^{-2}$ | 45 |

After exposure under the above-describrd irradiation conditions, the layer is removed in the irradiated areas analogously to Example 26, using the developer of Example 1. If initiators are used which absorb light in the short-wave range only, the resulting layers are barely sensitive to light, but possess normal electron beam sensitivity.

EXAMPLE 35

A wire-brushed aluminum foil is coated, on a whirler, with a solution of:
  4.0 p.b.w. of the novolak used in Example 2,
  1.2 p.b.w. of Compound No. 76,
  0.2 p.b.w. of the triazine used in Example 4, and
  0.1 p.b.w. of Crystal Violet, in
  94.5 p.b.w. of butan-2-one.

The foil is exposed for 20 seconds under an image to the light of a metal halide lamp and then developed by immersion in the developer used in Example 1. In this manner, the exposed areas of the coating are removed and a positive image of the original is produced.

Similar results are obtained when Compound No. 76 is replaced by Compound No. 77 or Compound No. 84, The latter compound requiring the use of the developer mentioned in Example 3.

EXAMPLE 36

Example 35 is repeated, but the triazine is replaced by the same quantity of 2,5-diethoxy-4-(p-ethoxyphenyl)-benzene-diazonium hexafluorophosphate and instead of Compound No. 76, the same quantity of Compound No. 78, Compound No. 80, or Compound No. 91, or half the quantity of Compound No. 93, is used as the ortho-carboxylic acid derivative. The material is developed with the developer used in Example 3. In each case, a positive copy of the original is obtained.

EXAMPLE 37

Layers in which the ortho-ester, a resin, or residual solvent are capable of simultaneously acting as an initiator also may be used for imaging by means of electron beams. For this prupose, 2 to 3 $\mu$ thick layers are applied to mechanically roughened aluminum, using one of the following four coating solutions:

(a)
  4.0 p.b.w. of the novolak used in Example 1,
  0.02 p.b.w. of Crystal Violet,
  1.2 p.b.w. of Compound No. 94, and
  94.8 p.b.w. of butanone.

(b)
  4.0 p.b.w. of the novolak used in Example 1,
  0.02 p.b.w. of Crystal Violet,
  1.2 p.b.w. of Compound No. 79, and
  94.8 p.b.w. of butanone.

(c)
  4.0 p.b.w. of the novolak used in Example 1,
  0.02 p.b.w. of Crystal Violet,
  1.2 p.b.w. of Compound No. 37,
  0.2 p.b.w. of a chlorodiphenyl resin ("Clophenharz W", a product of Bayer Leverkusen), and
  94.6 p.b.w. of butanone.

(d)
  4.0 b.p.w. of the novolak used in Example 1,
  0.02 p.b.w. of Crystal Violet,
  1.2 p.b.w. of Compound No. 37,
  38.0 p.b.w. of dichloro ethylene, and
  56.8 p.b.w. of butanone.

In the composition under c), the chlorodiphenyl resin may be replaced by the same quantity of a chloroparaffin resin.

| Layer | Voltage (kV) | Irradiated Energy (Joule/cm$^2$) | Developer used in Example | Developing Times |
|---|---|---|---|---|
| a | 11 | 50–300·10$^{-2}$ | 1 | 2 minutes |
| b | 11 | 100–600·10$^{-2}$ | 3 | 3 minutes |
| c | 11 | 10–80·10$^{-2}$ | 1 | 30 seconds |
| d | 11 | 10–80·10$^{-2}$ | 1 | 20 seconds |

After irradiation of the layers under the conditions stated above, the layer is removed in the irradiated areas analogously to Example 26. These layers are sensitive to electron beams only and thus may be processed under normal light conditions.

EXAMPLE 38

Layers of the following compositions also may be used for imaging with electron beams:

(a)
- 70.0 p.b.w. of the novolak used in Example 1,
- 25.0 p.b.w. of N-(2-tetrahydropyranyl)-N-(α-naphthyl)-N-phenyl amine,
- 4.7 p.b.w. of the triazine used in Example 4, and
- 0.3 p.b.w. of Crystal Violet.

(b)
- 70.0 p.b.w. of the novolak used in Example 1,
- 25.0 p.b.w. of N-(2-tetrahydropyranyl)-phenothiazine,
- 4.7 p.b.w. of the triazine used in Example 4, and
- 0.3 p.b.w. of Crystal Violet.

2 μ thick copying layers produced by applying butanone solutions of the above compositions to mechanically roughened aluminum and drying are irradiated under the conditions stated in Example 8. By irradiation with an energy of 20-100 . 10$^{-2}$ Joule/cm$^2$ in case (a) and 1-30. 10$^{-2}$ Joule/cm$^2$ in case (b), followed by treatment with the developer used in Example 1, a positive image is obtained within 3 minutes, in the case of composition (a), and within 1 minute, in the case of composition (b).

EXAMPLE 39

A solution composed of:
- 4.0 p.b.w. of the novolak used in Example 1,
- 1.2 p.b.w. of Compound No. 74,
- 0.2 p.b.w. of 2,5-diethoxy-4-p-tolylmercaptobenzenediazonium hexafluoro phosphate, and
- 0.1 p.b.w. of Crystal Violet, in
- 94.5 p.b.w. of butanone, is whirler-coated onto an electrolyticaly roughened and anodized aluminum foil in a manner such that the dried layer weighs 1.9 g/m$^2$. By a 10 seconds' exposure under an original, using a 5 kW metal halide lamp, a high contrast image is obtained which may be developed within 45 seconds to an offset printing plate by means of the developer used in Example 3, the exposed areas being thus removed.

In a printing test run on an offset machine, this plate yielded more than 140,000 copies of satisfactory quality. Similar results are obtained if Compound No. 74 in the above composition is replaced by the same quantity of one of the Compounds Nos. 3, 71, 72, 73, or 75, or of the oligomeric Compound No. 70, the light-sensitive acid donor being replaced in the case of the last-mentioned compound by 0.2 g of the trichloro methyl pyrone mentioned in Example 10.

EXAMPLE 40

Solutions containing 1.2 p.b.w. of any of the Compouns Nos. 81, 82, 87, 88, or 89, together with
- 4.0 p.b.w. of the novolak used in Example 1,
- 0.2 p.b.w. of 2-(4-methoxystyryl)-4,6-bis-trichloromethyl-s-triazine, and
- 0.05 p.b.w. of Crystal Violet, in
- 94.55 p.b.w. of butanone are whirler-coated onto wire-brushed aluminum and then exposed for 50 seconds under an original, using a metal halide lamp. By development with the developer used in Example 3, a positive image is obtained in each case within one minute, at the most.

Similar results are obtaned by using one of the compounds Nos. 83, 85, 86, 90 or 92 as the o-carboxylic acid derivative in the above composition and removing the exposed areas by means of the developer used in Example 1.

EXAMPLE 41

This example shows the suitability of resins containing o-ester groups in their side chains as components capable of being split by acids in positive-working copying compositions.

2 μ thick layers of the following composition, which are colored by Crystal Violet and contain butanone as the solvent, are applied to mechanically roughened aluminum and dried in the normal manner:

| Compound (Contents in %) | Resin (Contents in %) | Initiator (Contents in %) | Exposure Time (seconds) |
|---|---|---|---|
| 97 (48.3) | of Ex. 2 (48.3) | 3.4 | 50 |
| 98 (48.3) | of Ex. 2 (48.3) | 3.4 | 50 |
| 99 (96.3) | — | 3.7 | 100 |
| 100 (22.2) | of Ex. 1 (74.1) | 3.7 | 50 |
| 101 (22.2) | of Ex. 1 (74.1) | 3.7 | 50 |
| 102 (96.3) | — | 3.7 | 100 |

After imagewise exposure under a metal halide lamp, the layers may be developed within 100 seconds by means of the developer used in Example 3, the areas of the layers struck by light being removed.

2,5-diethoxy-4-p-tolylmercapto-benzene diazonium hexafluorophosphate is used as the initiator, i.e. the light-sensitive acid donor.

EXAMPLE 42

This example shows that similarly to o-naphthoquinone diazide layers, o-ester layers also can be converted into offset plates by thermal treatment after development. For this purpose, a coating composition is prepared composed of:
- 6.0 p.b.w. of the novolak used in Example 1,
- 2.0 p.b.w. of Compound No. 95,
- 0.2 p.b.w. of the triazine used in Example 4,
- 0.01 p.b.w. of Crystal Violet, in
- 91.8 p.b.w. of butanone.

Further solutions are prepared in which Compound No. 95 is replaced by the same quantity of Compounds Nos. 96, 103, 37, 4, or 72.

Mechanically roughened aluminum foils coated with these solutions are exposed in the normal manner and developed with the developer used in Example 1.

In order to increase the chemical and mechanical resistance of the layers, for example, to wash out solutions, correcting agents, UV-hardenable printing inks and the printing stress in an offset machine, the imaged plates are heated to 240° C for 10 minutes. After this heat treatment, the plates are again treated for three minutes with the developer in order to clean the image-free areas. Corrections should be made prior to the heat treatment, because the layers are resistant to the action of correcting agents for some time after the treatment.

It will be obvious to those skilled in the art that many modifications may be made within the scope of the present invention without departing from the spirit thereof, and the invention includes all such modifications.

What is claimed is:

1. A radiation-sensitive copying composition comprising a compound (1) which splits-off an acid upon irradiation and a compound (2) having at least one group selected from the group consisting of a carboxylic ortho acid ester group and a carboxylic acid amide acetal group, which composition, upon irradiation, forms and exposure product having a higher solubility in a liquid developer than the non-irradiated composition.

2. A copying composition according to claim 1, in wchih the compound (2) corresponds to the following general formula I

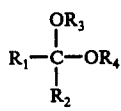

wherein
$R_1$ is H, a substituted or unsubstituted alkyl group, a substituted or unsubstituted phenyl group, or a substituted or unsubstituted cycloalkyl group,
$R_2$ is $R_5O$, $R_6(R_7)N$, or $R_8\underline{\quad}N$,
(a) $R_3$ and $R_4$ are the same or different and each represents an alkyl, alkenyl, cycloalkyl, cycloalkenyl, or aryl groups which may be substituted, and
$R_5$ is a group of the meaning stated above for $R_3$ and $R_4$, or an acyl group, or, when $R_1$ = H and $R_3$ = $R_4$ = phenyl, a methylene amino radical which may be substituted, or
(b) of $R_3$, $R_4$, and $R_5$, two belong to a common ring which may be substituted,
$R_6$ is an acyl or sulfonyl group or a methylene amino group which may be substituted,
$R_7$ is an alkyl or phenyl group, and
$R_8$ together with the nitrogen atom, forms a, possibly substituted, 4 to 13 membered heterocyclic ring which may contain N, O, or S as further hetero atoms and to which 1 to 2 possibly substituted aromatic rings or a cycloaliphatic ring may be fused,
and wherein the groups $R_1$, $R_2$, $R_3$, and $R_4$, taken togehter, contain at least 10 carbon atoms.

3. A copying composition according to claim 2 in which in the compound corrsponding to Formula I, $R_1$ is H, methyl, ethyl, cyclohexyl, or phenyl.

4. A copying composition according to claim 2 in which in the compound corresponding to Formula I, the groups, $R_1$, $R_2$, $R_3$, and $R_4$, taken together, have at least 14 carbon atoms.

5. A copying composition according to claim 2 in which in the compound corresponding to Formula I, $R_2$ is $R_5O$.

6. A copying composition according to claim 2 in which the compound corresponding to Formula I, the group

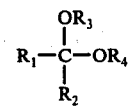

is contained at least twice.

7. A copying composition according to claim 5 in which at least one of the groups, $R_3$, $R_4$, and $R_5$ is an aromatic residue.

8. A copying composition according to claim 7 in which the aromatic residue corresponds to the following general Formula III

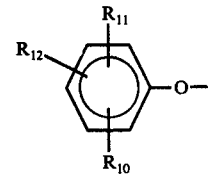

wherein
$R_{10}$, $R_{11}$, and $R_{12}$ are the same or different and are H, alkyl groups with 1 to 6 carbon atoms which may be substituted by alkoxy, alkoxycarbonyl, or acyl groups with 1 to 3 carbon atoms each, or by halogen atoms or cyanide groups; alkoxy groups with 1 to 6 carbon atoms, acyl groups with 1 to 7 carbon atoms; alkoxycarbonyl groups with 1 to 5 carbon atoms; halogen atoms; cyanide or nitro groups; aryloxy-, thiophenyl- or arylsulfonyl groups with 6 to 15 carbon atoms each; or aralkyl groups with 7 to 12 carbon atoms,
or, alternatively,
$R_{10}$ is hydrogen, and
$R_{11}$ and $R_{12}$ are methine groups necessary for the formation of a fused benzene ring.

9. A copying composition according to claim 2 in which the compound corresponding to Formula I,
$R_3$ and $R_4$ are interconnected to form a linear alkylene chain with 2 or 3 carbon atoms which is unsubstituted or substituted by alkyl, alkoxy or alkoxycarbonyl groups with 1 to 6 carbon atoms each or by halogen atoms, cyano, phenoxy, phenoxyalkyl or benzyloxy groups, or which may be connected with a further 5- or 6- membered ring through a common spiro-carbon atom, and
$R_5$ is an alkylene chain of the same structure as that defined for $R_3$ and $R_4$, the second free valence of which is bonded to a further group of the formula $-O-C(R_1)(OR_3)(OR_4)$.

10. A copying composition according to claim 2 in which in the compound corresponding to Formula I,
$R_3$ and $R_4$, together with the group —O—C—O—, form a 5- or 6-membered ring which is unsubstituted or substituted by alkyl groups, alkoxy groups, alkoxycarbonyl groups with 1 to 6 carbon atoms each, or by halogen atoms, cyano groups, phenoxy groups, phenoxyalkyl groups, or benzyloxy groups, or which may be connected with a further 5- or 6-membered ring through a common spiro-carbon atom, and
$R_5$ is an alkyl group with 1 to 15 carbon atoms in which the chain may be interrupted by oxygen atoms, or an alkylene group with 2 to 20 carbon atoms, the chain of which also may be interrupted by oxygen atoms, and the free second valence of which is bonded to a further group of the formula —O—C(R₁)(OR₃)(OR₄), the alkyl or alkylene groups being substituted by phenoxy groups, if desired.

11. A copying composition according to claim 1 in which the compound (1) which splits-off acid during irradition is an organic halogen compound containing more than one halogen atom attached to a carbn atom or to an aromatic ring.

12. A copying composition according to claim 1 in which the compound (1) which splits-off acid during irradiation (1) is a lightsensitive diazo compound.

13. A copying composition according to claim 1 additionally containing a binder.

14. A copying composition according to claim 12 in which the binder is an alkali-soluble resin.

15. A copying composition according to claim 13 in which the alkalisoluble resin is a phenol resin.

16. In the process for recording high-energy radiation which comprises
 (a) imagewise irradiating a radiation-sensitive recording material composed of a support and a radiation-sensitive layer in such doses that the solubility of the layer, especially in water and aqueous solution, increases in the irradiated areas, and
 (b) removing the irradiated areas with a liquid developer, the improvement wherein said layer comprises a compound (1) which splits-off acid during irradiation, and a compound (2) which contains at least one group selected from the group consisting of a carboxylic ortho acid ester group and a carboxylic acid amide acetal group.

* * * * *